(12) United States Patent
Wu et al.

(10) Patent No.: US 10,756,087 B2
(45) Date of Patent: Aug. 25, 2020

(54) SEMICONDUCTOR DEVICE AND METHOD

(71) Applicant: Taiwan Semiconductor Manufacturing Company, Ltd., Hsinchu (TW)

(72) Inventors: Chung-Chiang Wu, Taichung (TW); Shih-Hang Chiu, Taichung (TW); Chih-Chang Hung, Hsinchu (TW); I-Wei Yang, Yilan County (TW); Shu-Yuan Ku, Zhubei (TW); Cheng-Lung Hung, Hsinchu (TW); Da-Yuan Lee, Jhubei (TW); Ching-Hwanq Su, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/010,366

(22) Filed: Jun. 15, 2018

(65) Prior Publication Data
US 2019/0386002 A1 Dec. 19, 2019

(51) Int. Cl.
*H01L 27/088* (2006.01)
*H01L 29/06* (2006.01)
*H01L 27/11* (2006.01)
*H01L 21/8234* (2006.01)
*H01L 29/66* (2006.01)

(52) U.S. Cl.
CPC .. *H01L 27/0886* (2013.01); *H01L 21/823431* (2013.01); *H01L 21/823481* (2013.01); *H01L 27/1104* (2013.01); *H01L 29/0649* (2013.01); *H01L 29/66545* (2013.01)

(58) Field of Classification Search
CPC ............ H01L 27/0886; H01L 27/1104; H01L 21/823431; H01L 21/823481; H01L 29/0649; H01L 29/66545
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2014/0282326 A1 | 9/2014 | Chen et al. | |
| 2015/0008533 A1* | 1/2015 | Liaw | H01L 27/1104 257/392 |
| 2016/0181425 A1* | 6/2016 | Bai | H01L 29/7848 438/283 |

* cited by examiner

*Primary Examiner* — Mark W Tornow
(74) *Attorney, Agent, or Firm* — Slater Matsil, LLP

(57) ABSTRACT

A method includes forming a first semiconductor fin in a substrate, forming a metal gate structure over the first semiconductor fin, removing a portion of the metal gate structure to form a first recess in the metal gate structure that is laterally separated from the first semiconductor fin by a first distance, wherein the first distance is determined according to a first desired threshold voltage associated with the first semiconductor fin, and filling the recess with a dielectric material.

20 Claims, 25 Drawing Sheets

US 10,756,087 B2

SEMICONDUCTOR DEVICE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
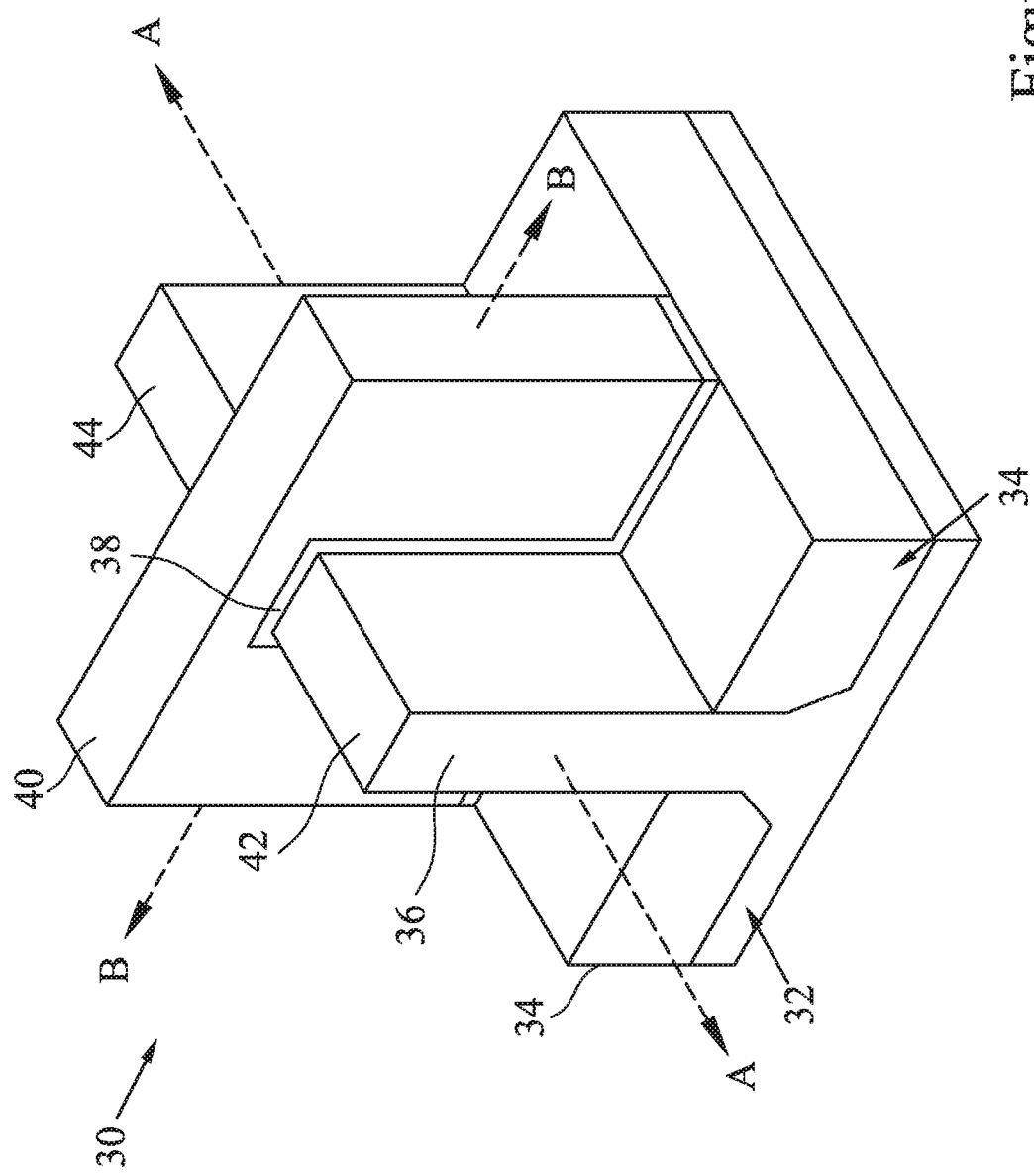
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, techniques for manufacturing a FinFET device having a particular threshold voltage. In some embodiments, the threshold voltage of a FinFET may be controlled by selecting the distance a fin of the FinFET device is separated from an isolation feature. Various embodiments discussed herein allow for increasing the available range of threshold voltages that FinFET devices may have. Various embodiments presented herein are discussed in the context of FinFETs formed using a gate-last process. In other embodiments, a gate-first process may be used. The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins. In some embodiments, the FinFETs and techniques described herein may be used for a semiconductor device such as an SRAM device. For example, the FinFETs described herein may be used in an SRAM cell, such as for one or more transistors (e.g., pass gate transistors, pull-up transistors, pull-down transistors, etc.) in a six-transistor (6T) SRAM cell or another type of SRAM cell. This is intended as a non-limiting example of a semiconductor device, and the FinFETs and techniques described herein may be used for other types of semiconductor devices.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate fill 40 (also referred to as a gate) is over the gate dielectric 38. Source/drain regions 42 and 44 are in the fin on opposite sides of the gate dielectric 38 and gate fill 40. FIG. 1 further illustrates reference cross-sections that are used in later figures. Cross-section B-B extends along a longitudinal axis of the gate fill 40 of the FinFET 30. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

Figure 2:
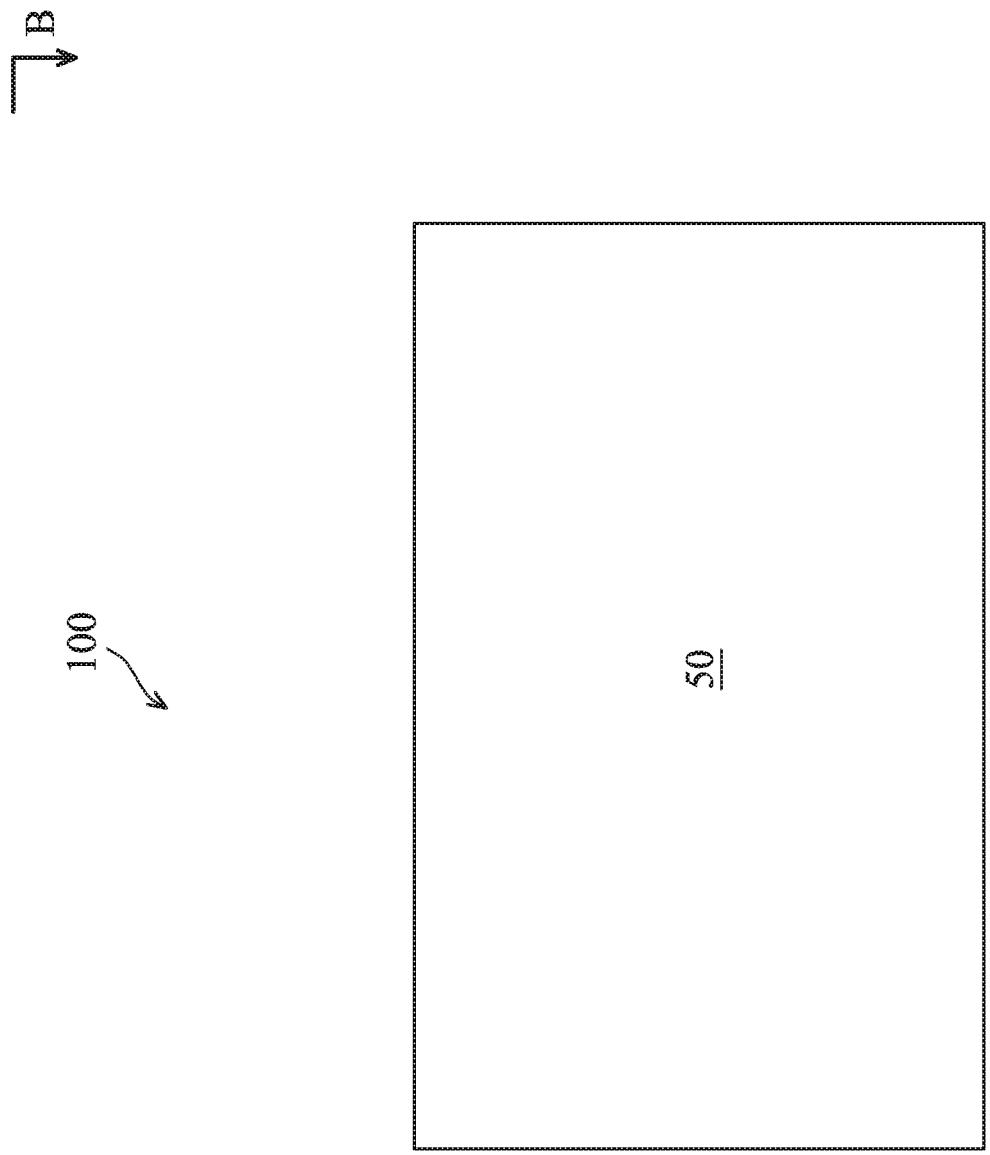
FIGS. 2-14B illustrate various views (e.g., cross-sectional views, plan views) of a FinFET device at various stages of fabrication, in accordance with an embodiment.
Figure 3:
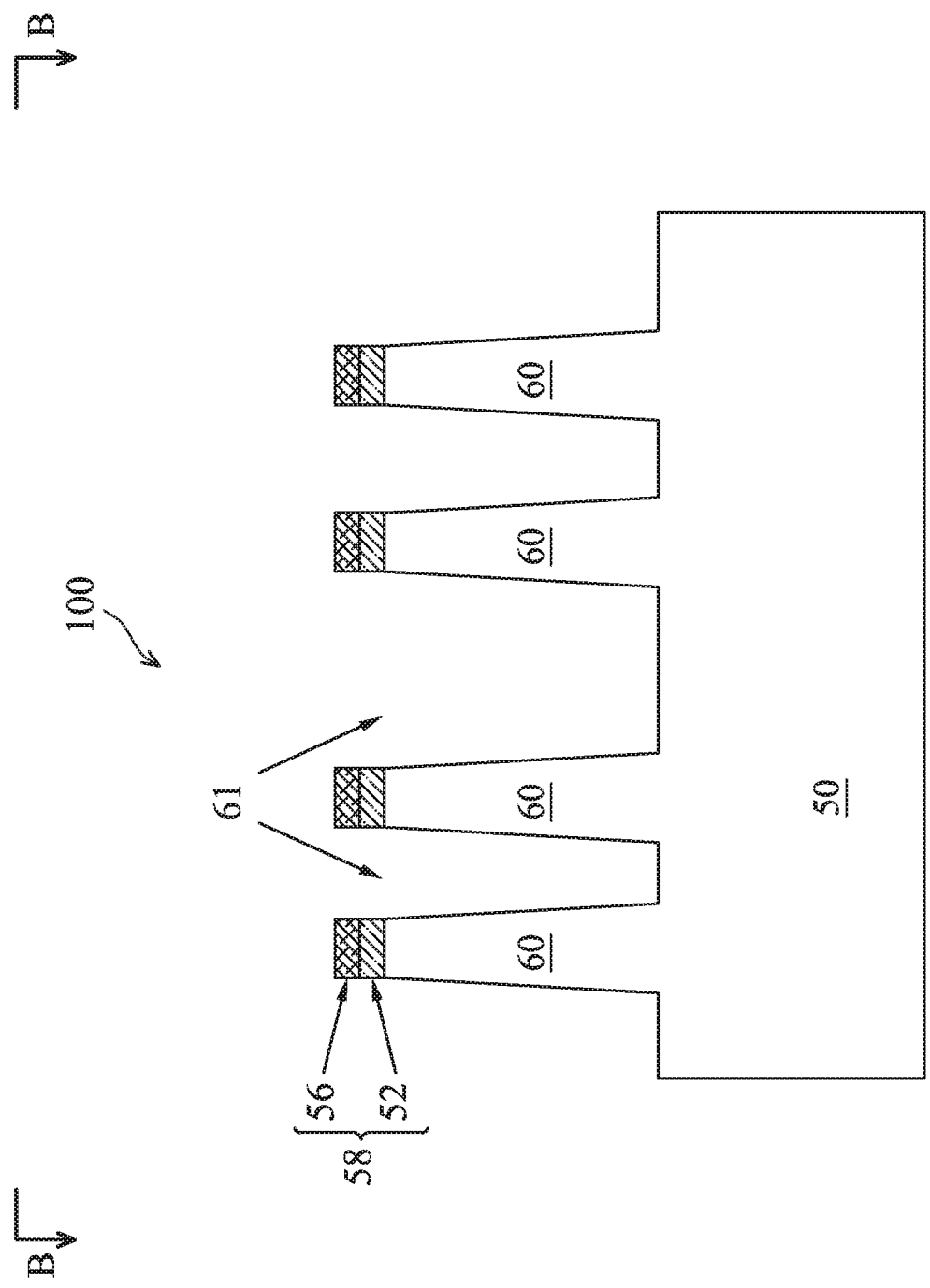
Figure 4:
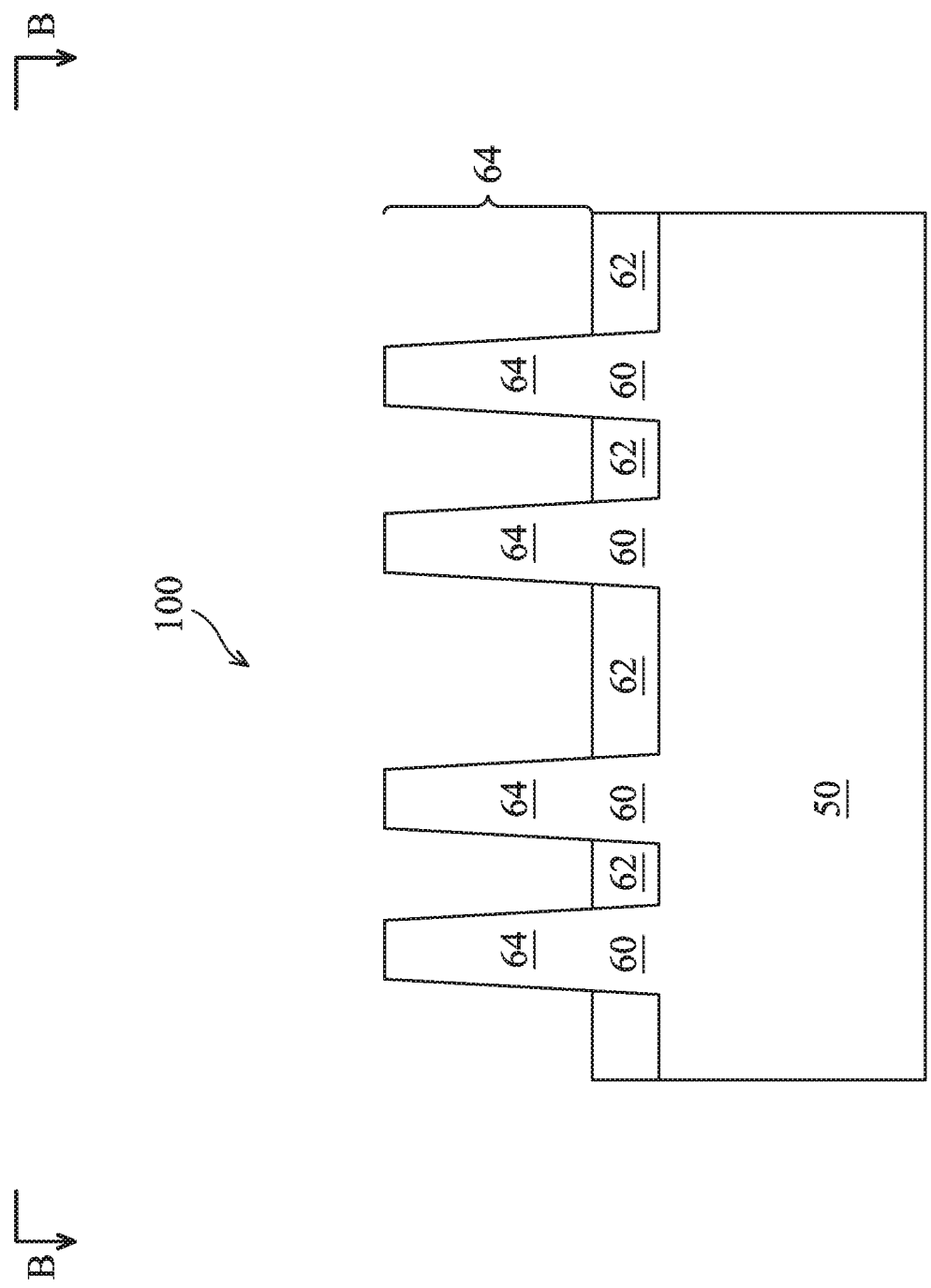
Figure 5A:
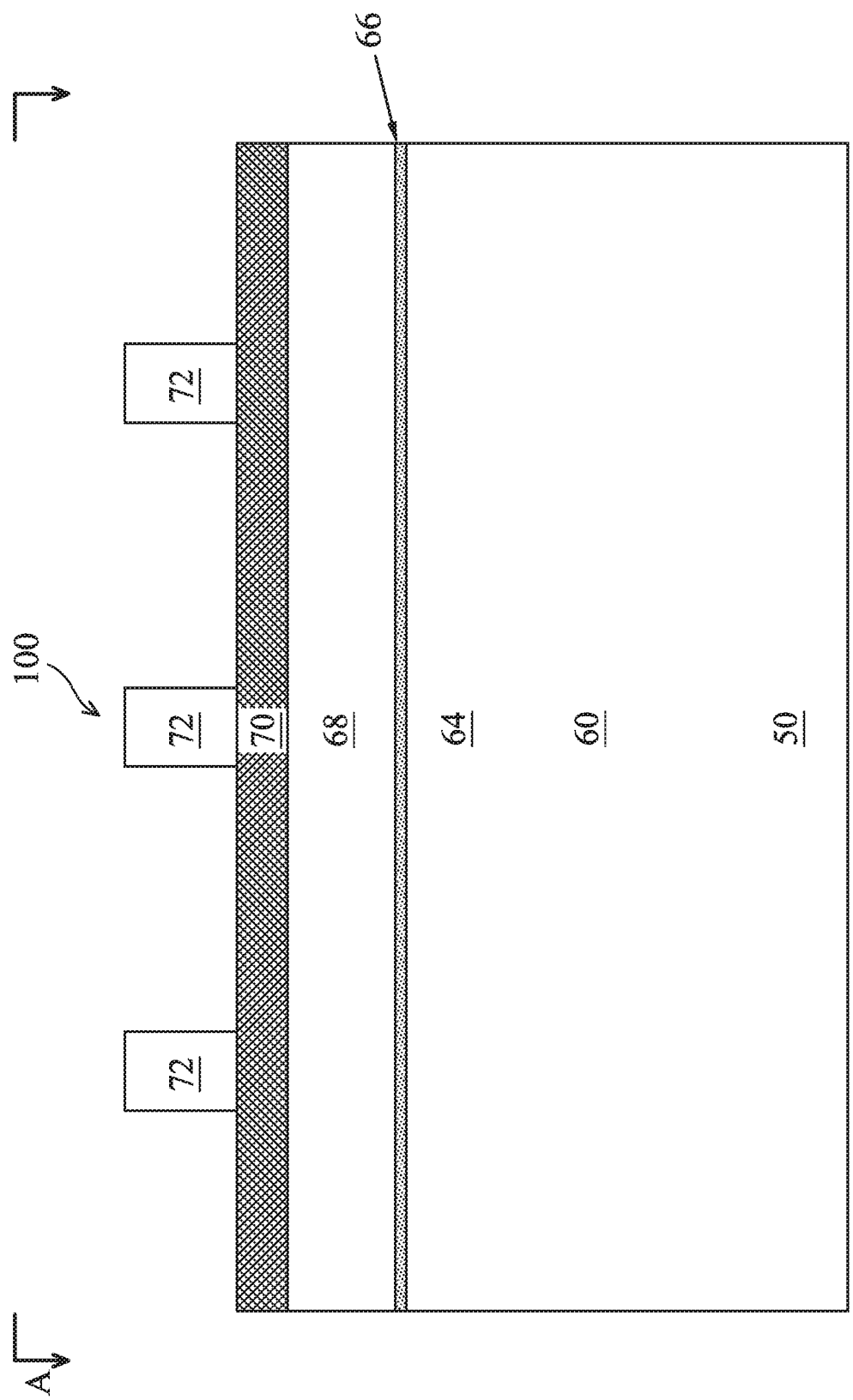
Figure 5B:
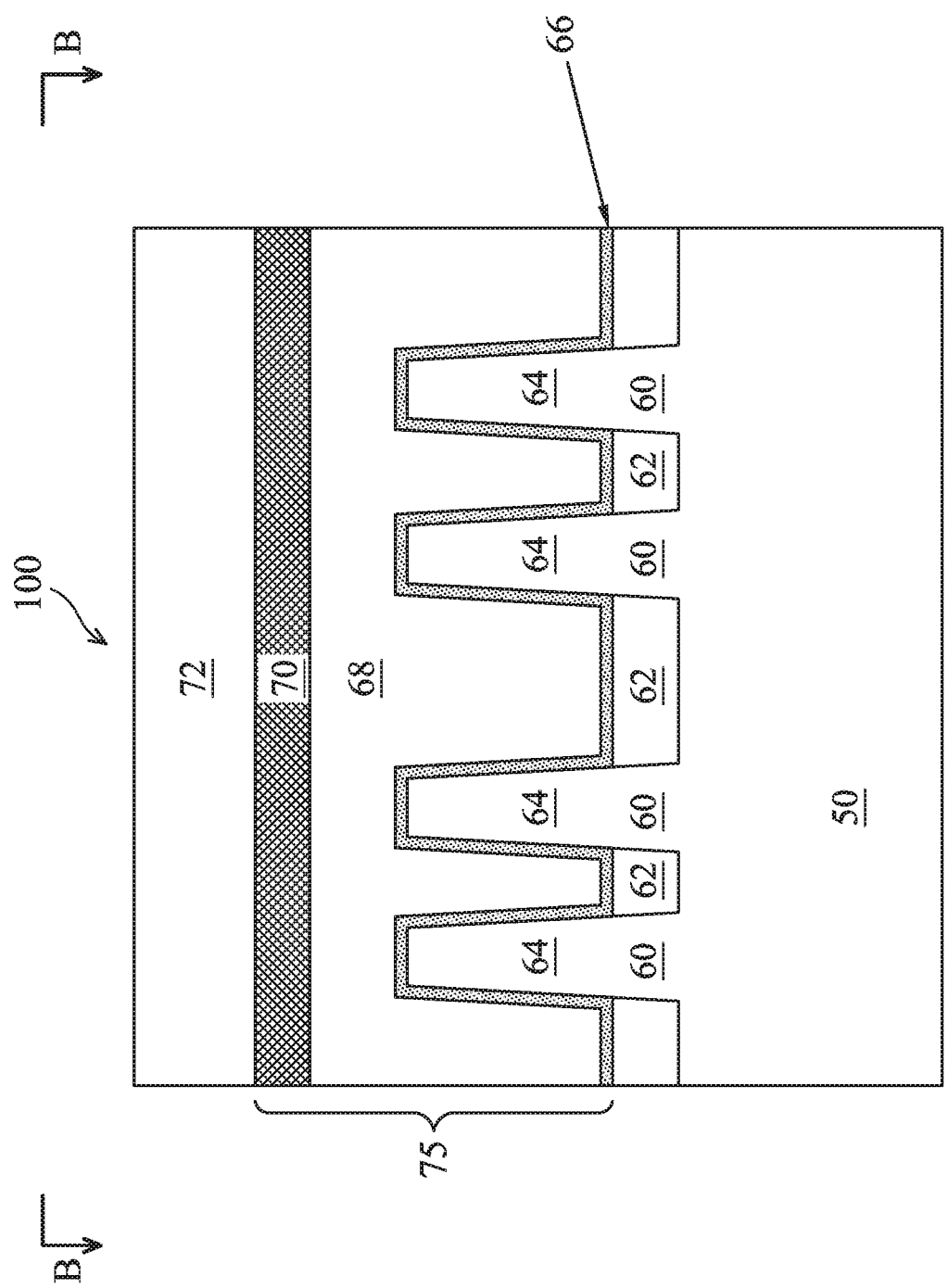
Figure 11A:
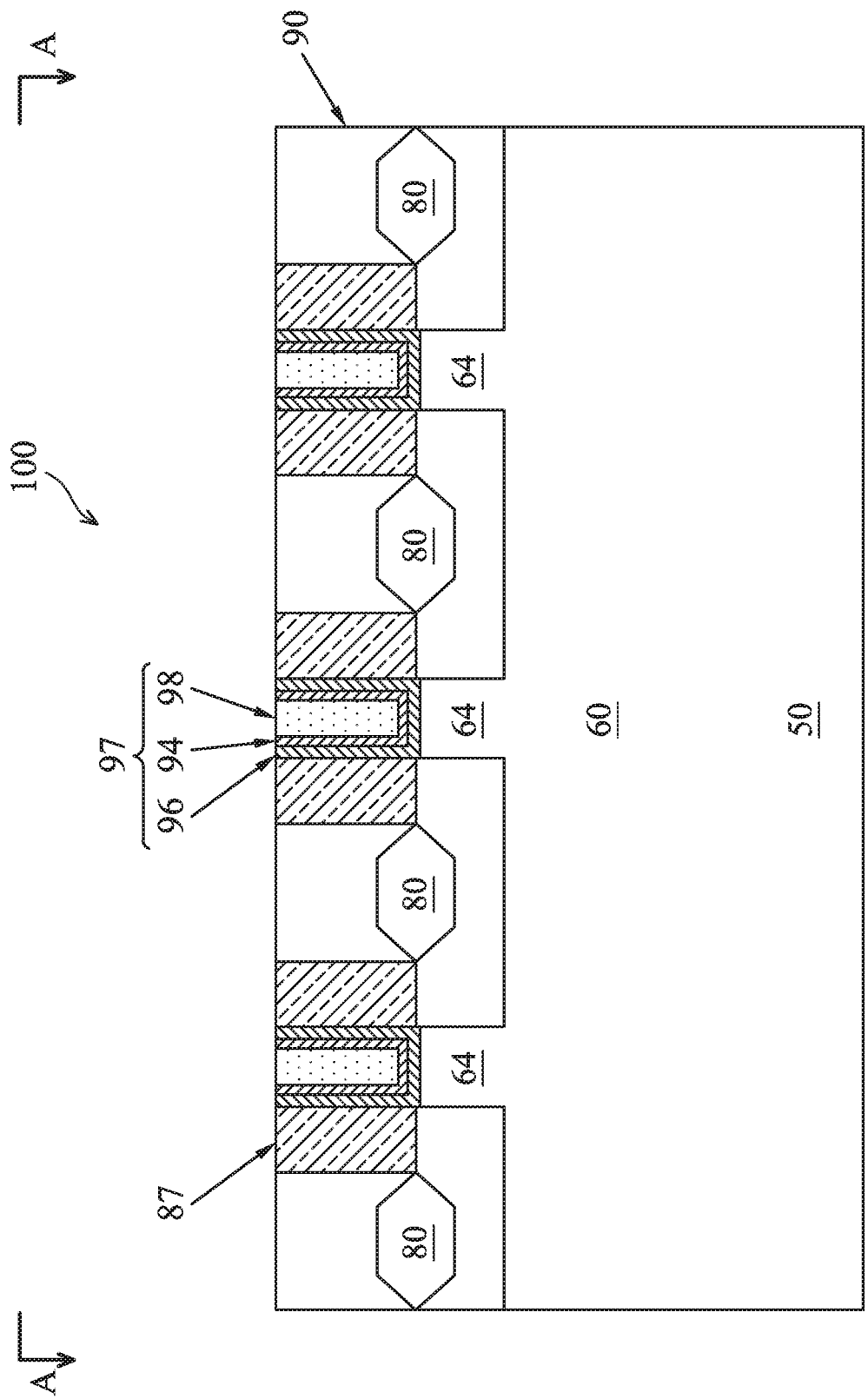
Figure 11B:
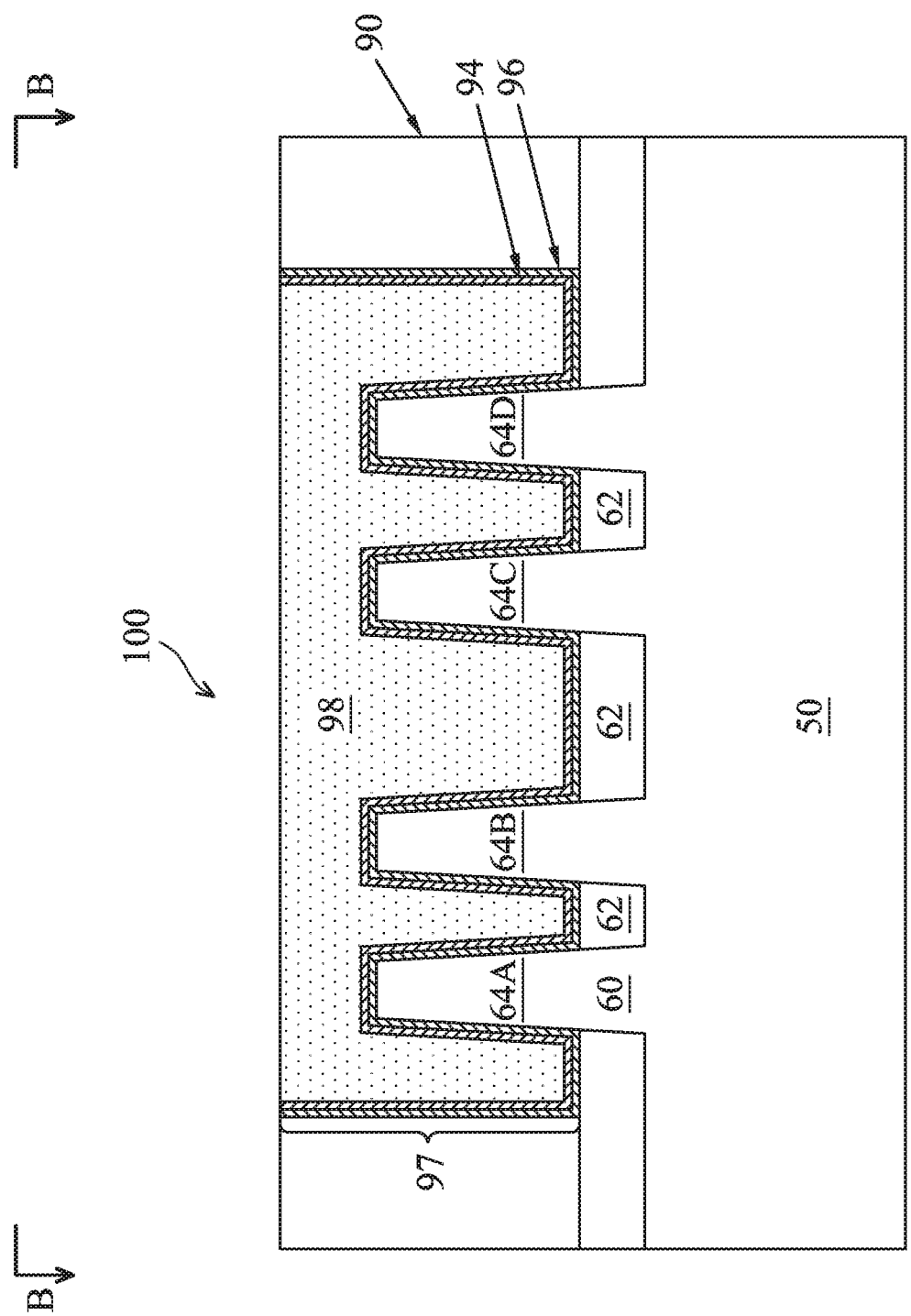
Figure 11C:
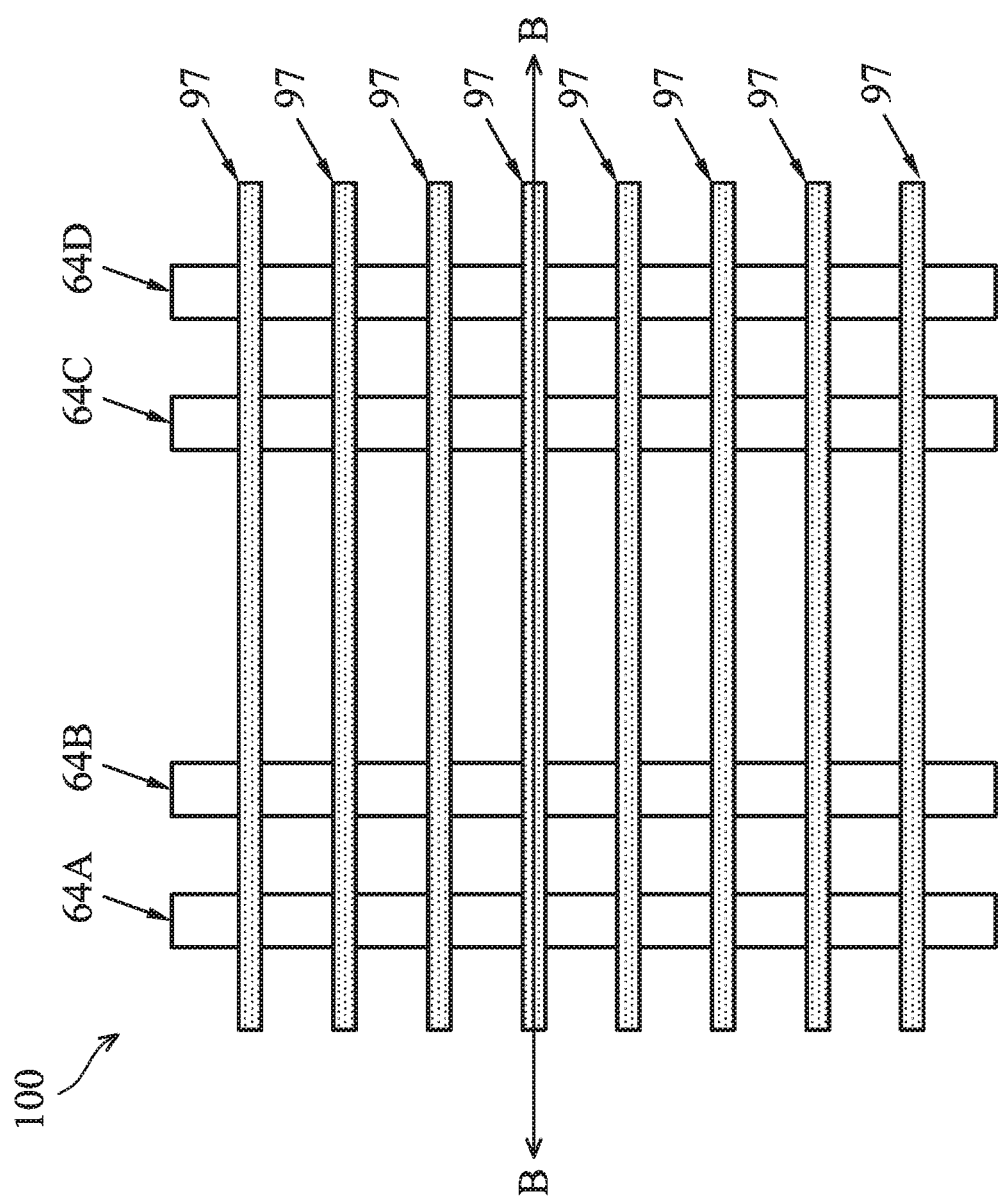
Figure 12A:
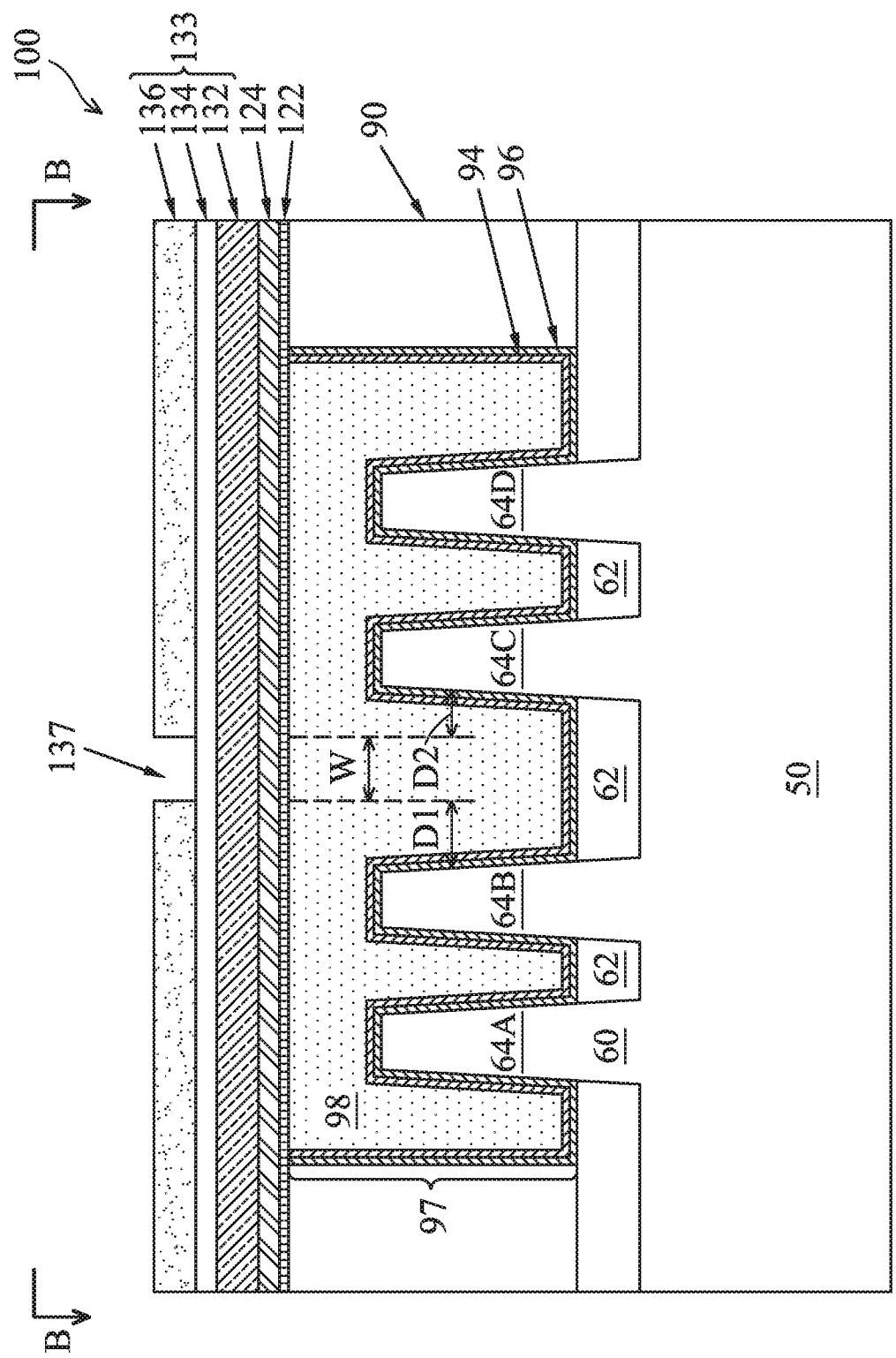
Figure 12B:
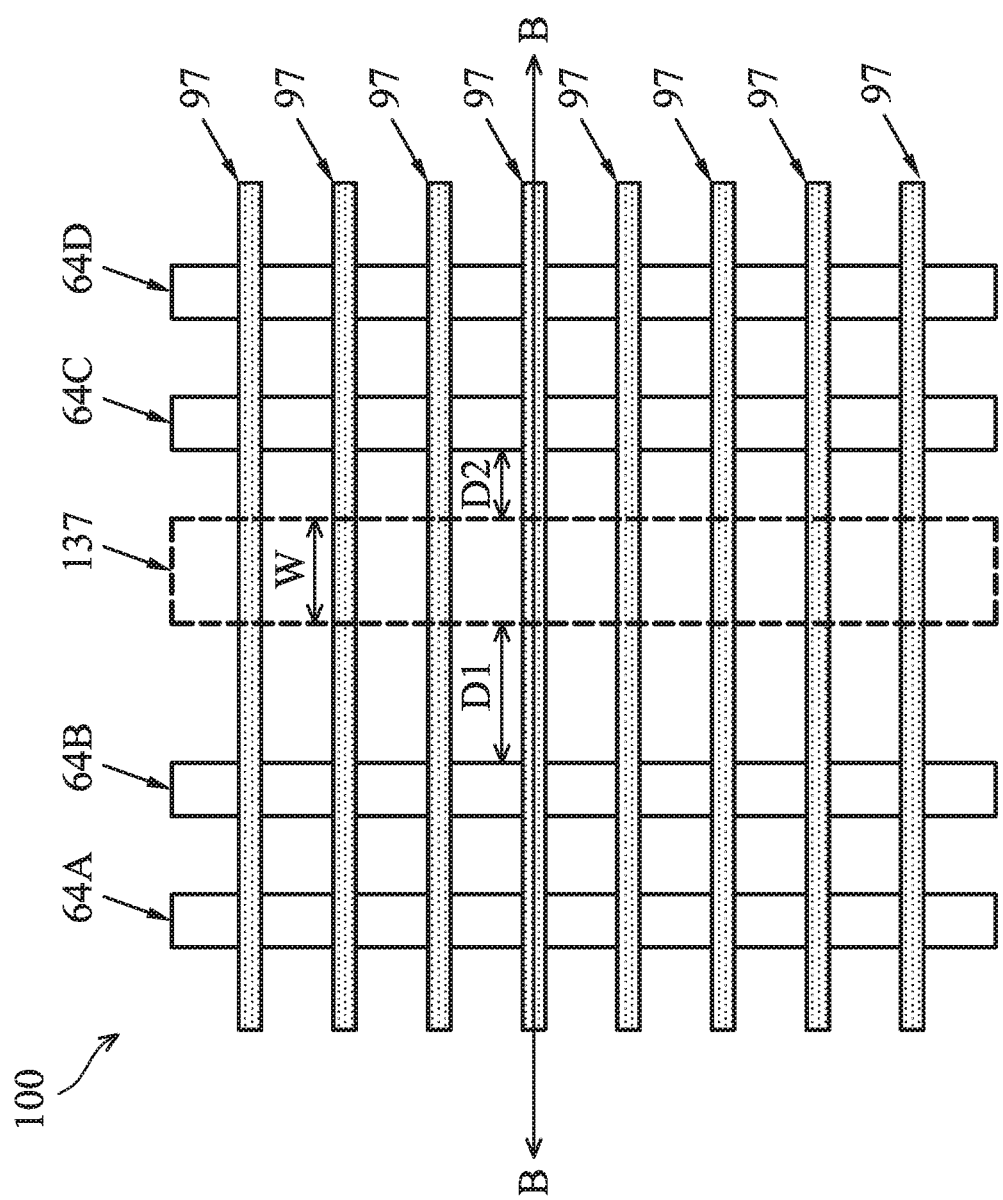
Figure 13:
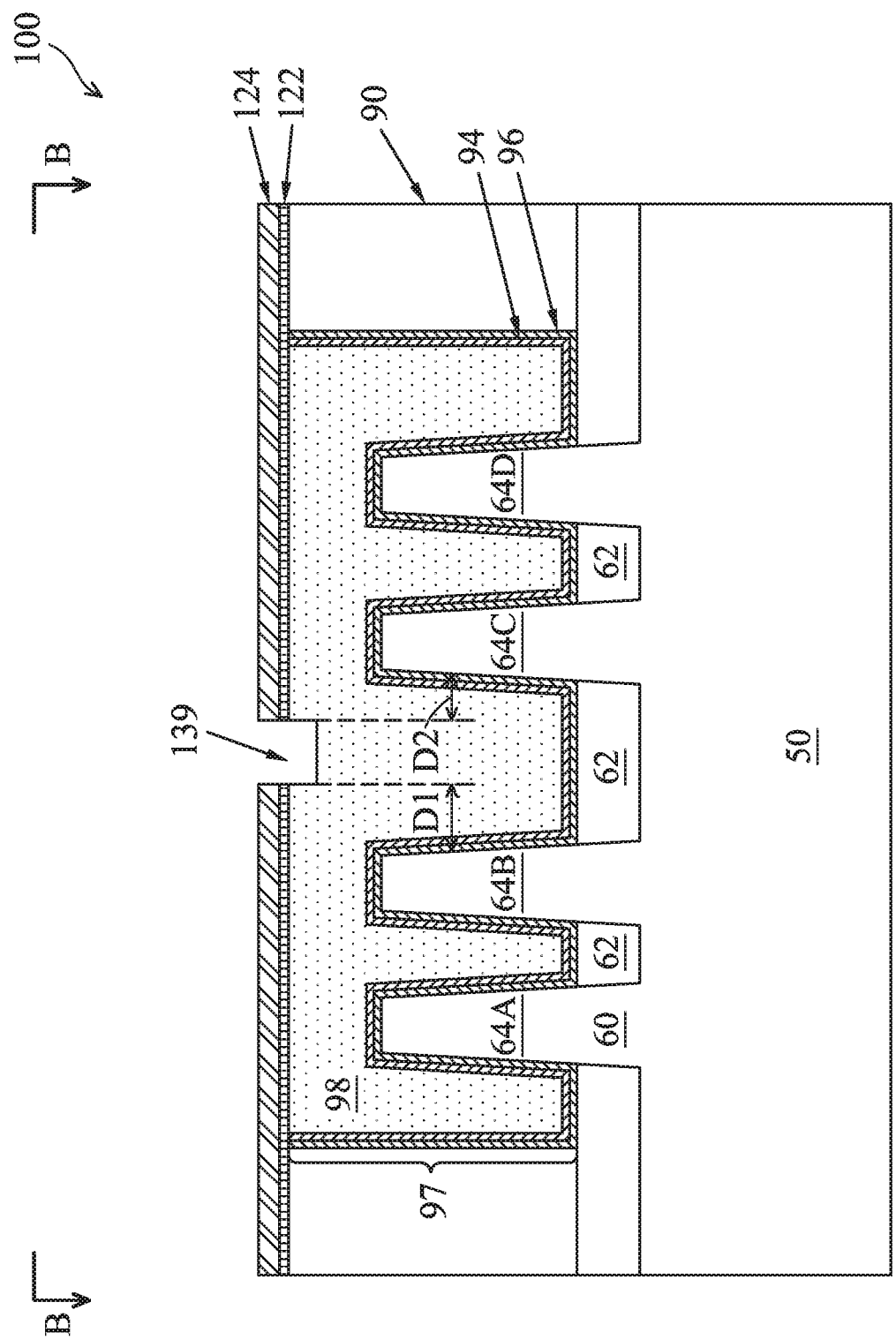
Figure 14A:
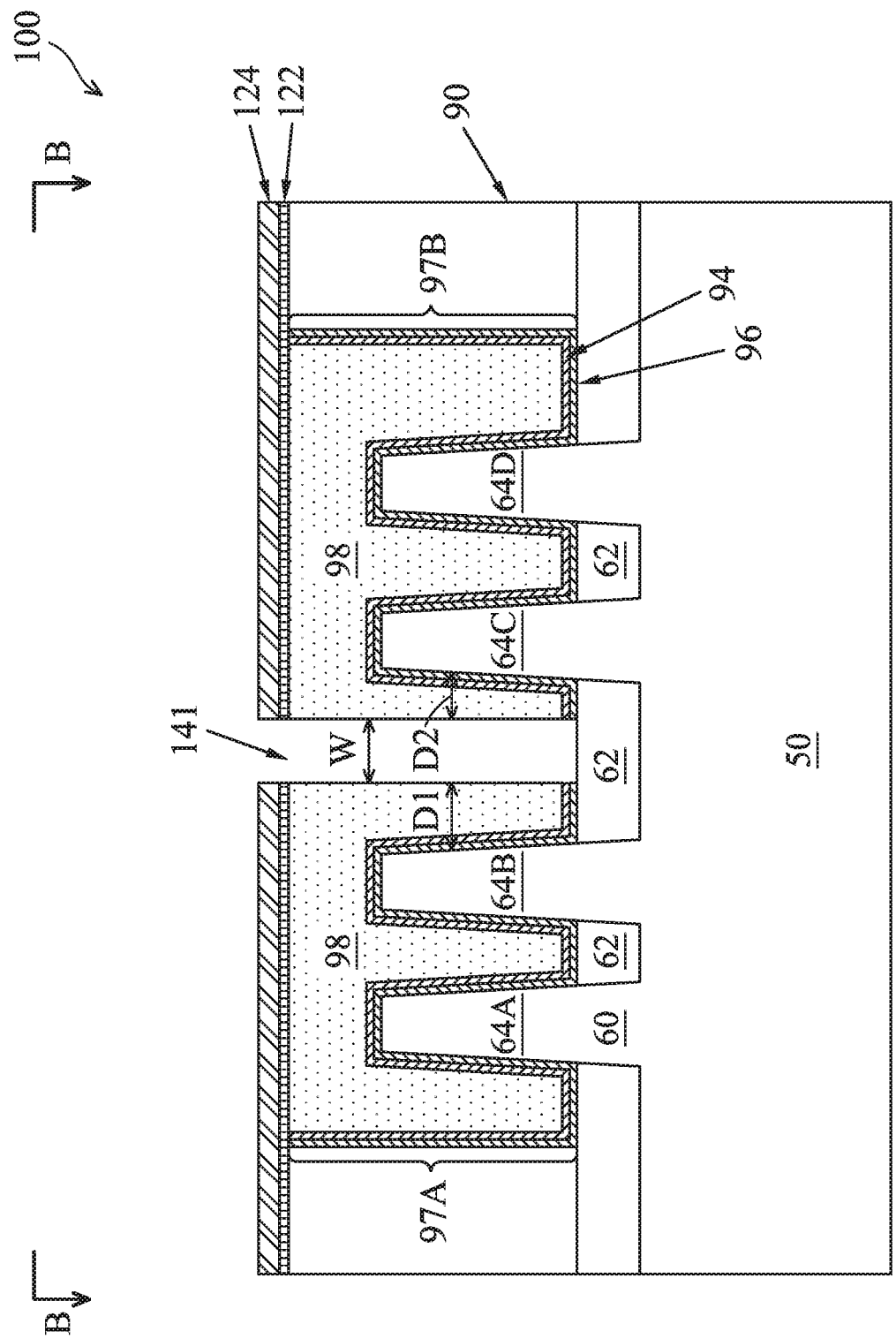
Figure 14B:
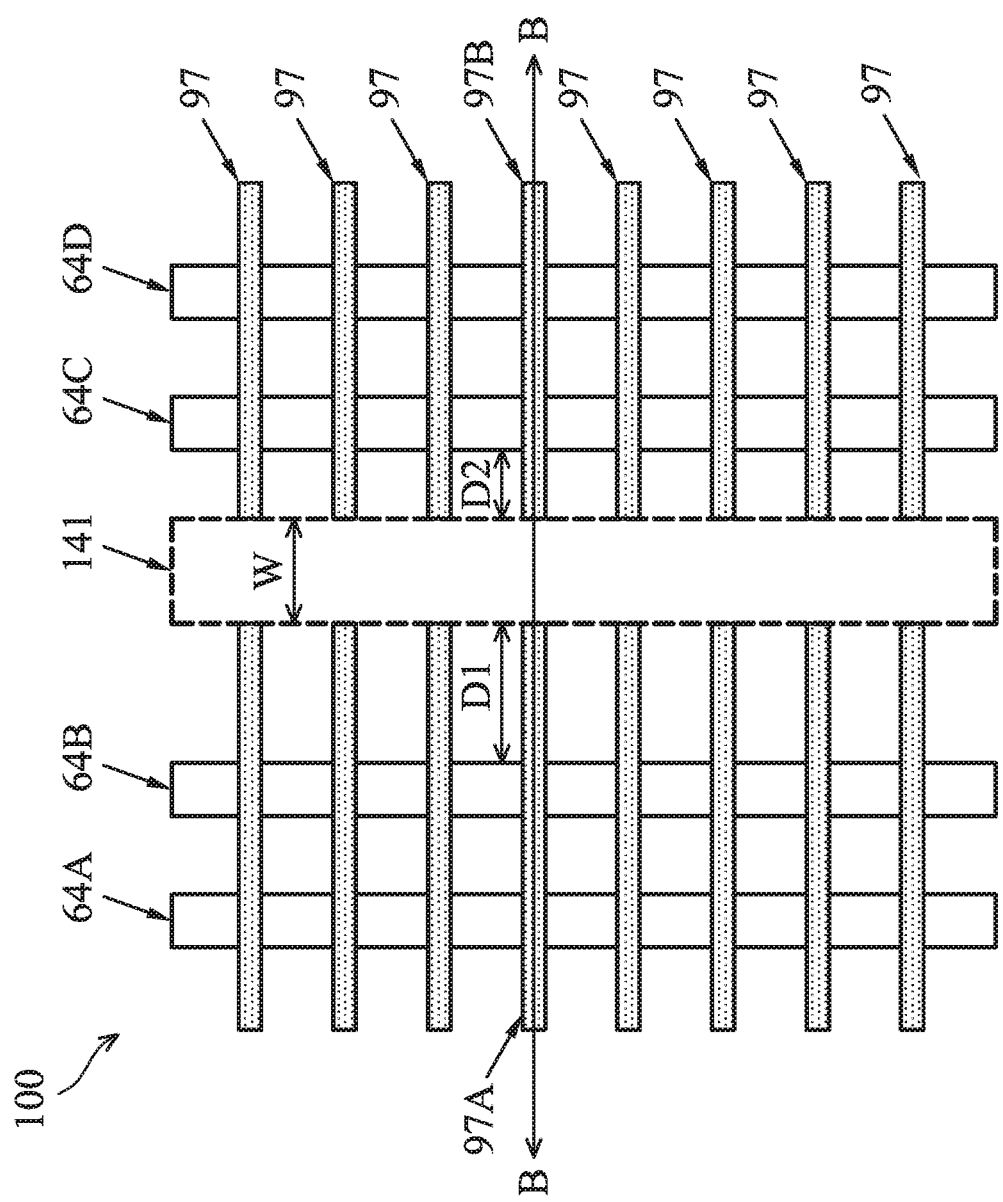
Figure 17:
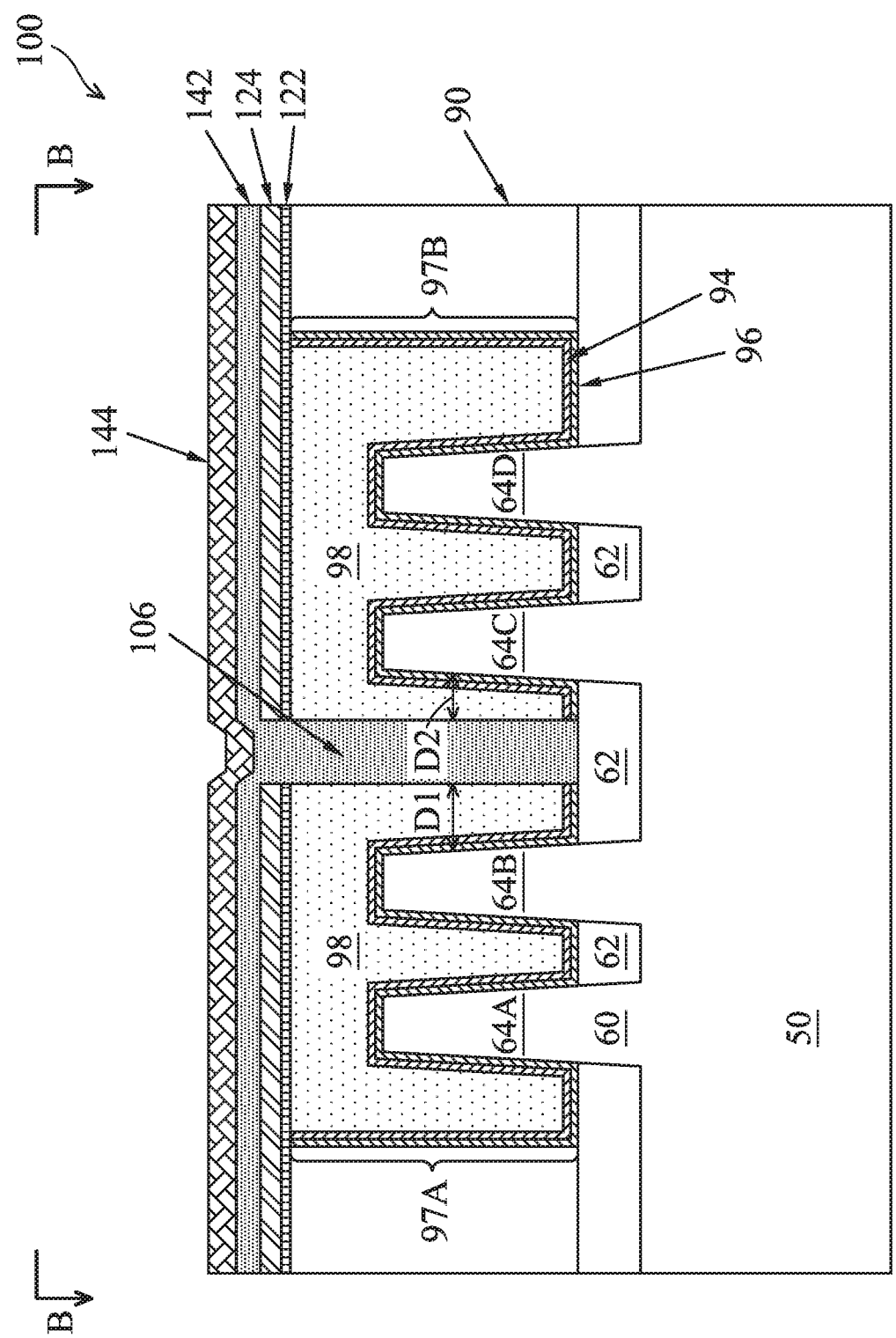
FIGS. 17-19 illustrate illustrate various views (e.g., cross-sectional views, plan views) of a FinFET device at various stages of fabrication, in accordance with an embodiment.
Figure 18A:
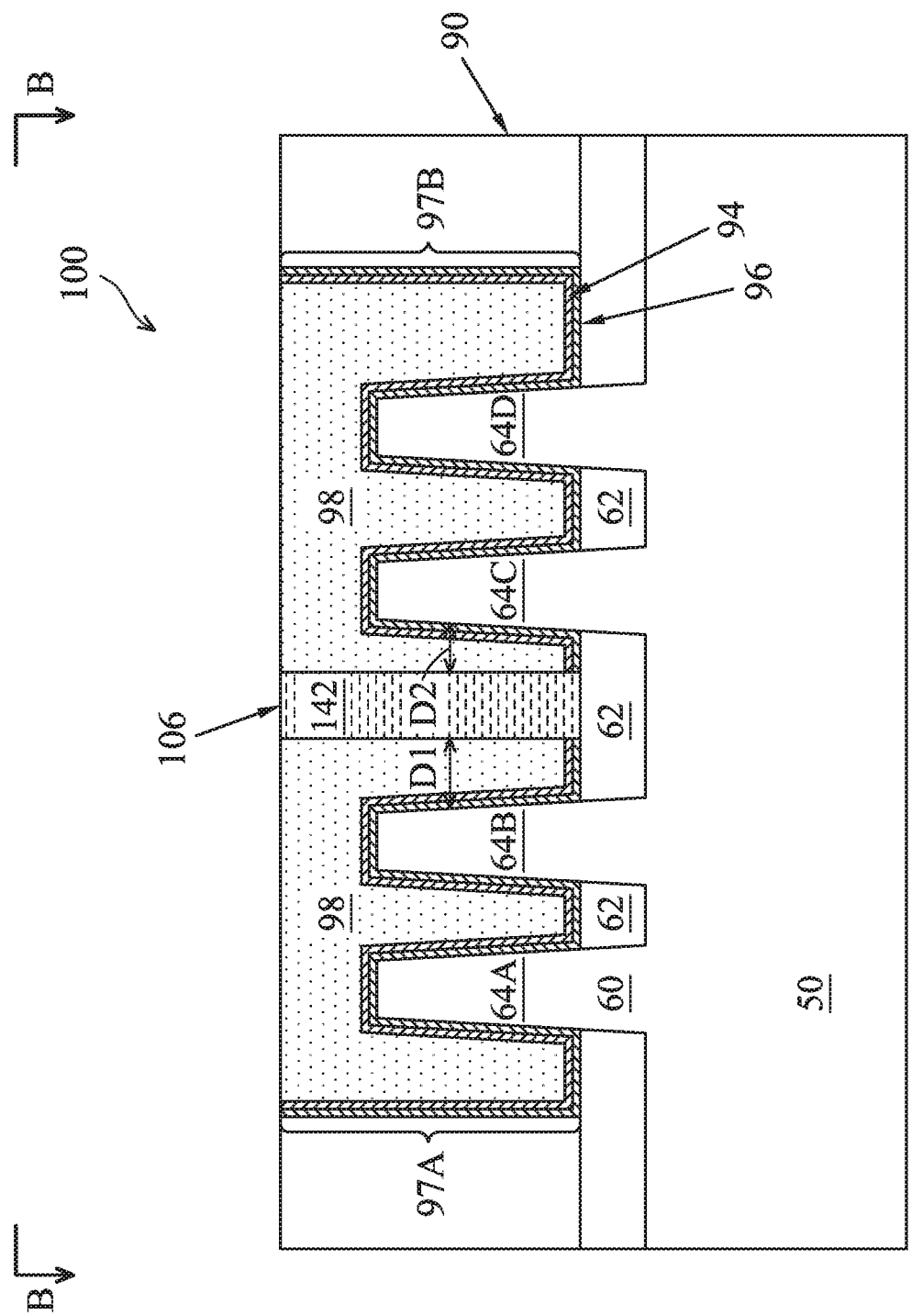
Figure 18B:
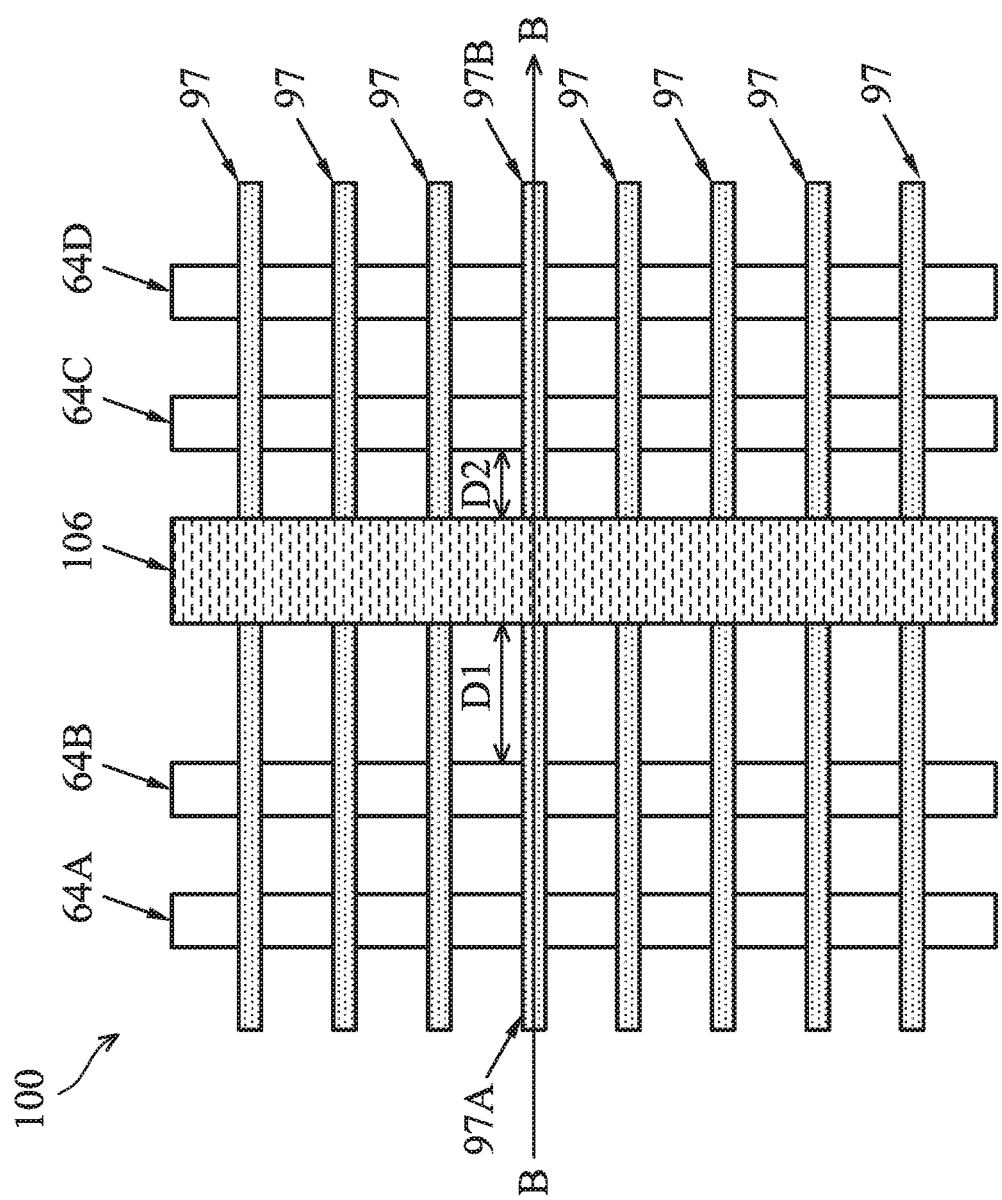
Figure 19:
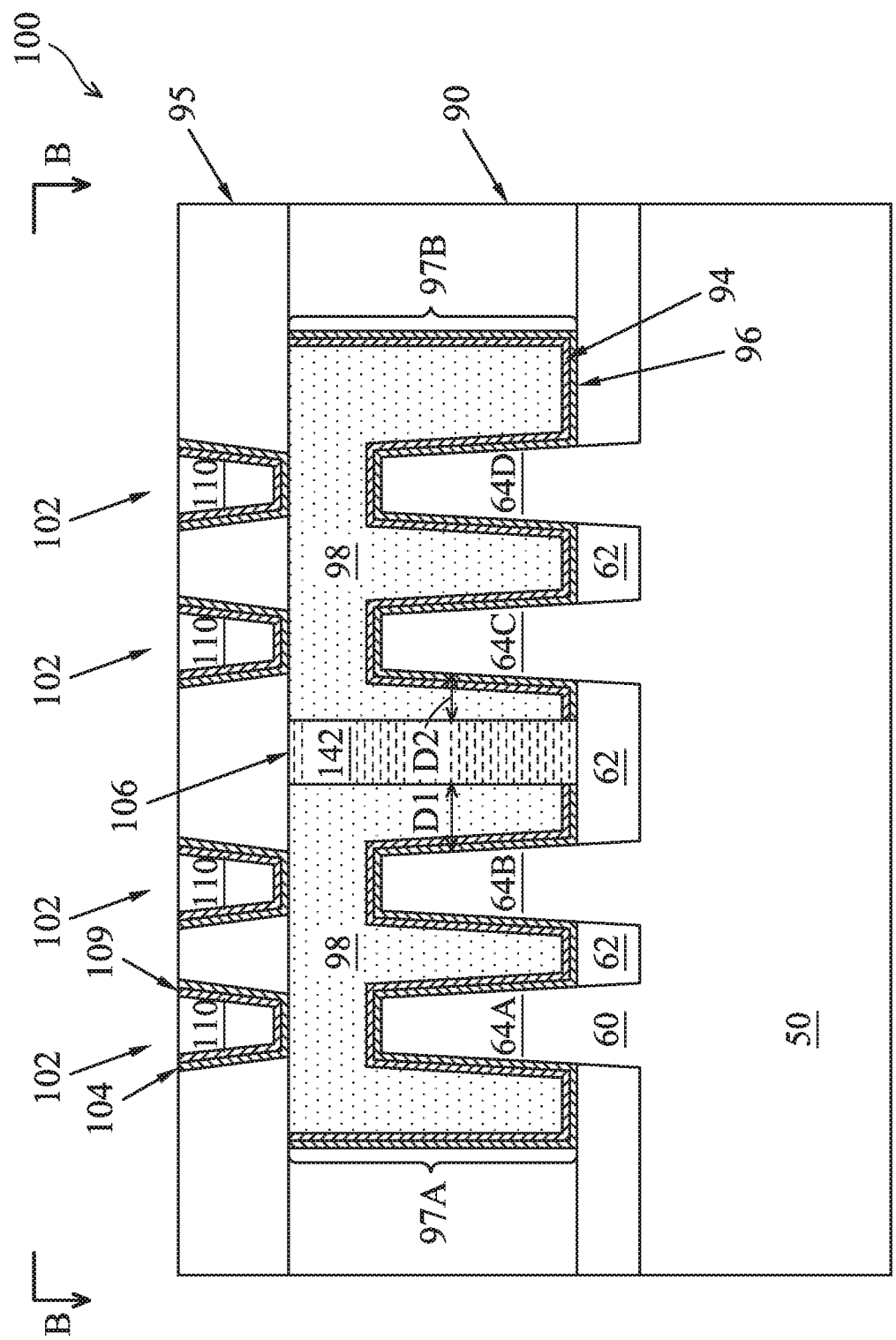

FIGS. 2-14B and 17-19 illustrate various views (e.g., cross-sectional views or plan views) of a FinFET device 100 at various stages of fabrication in accordance with some embodiments. The FinFET device 100 is similar to the FinFET 30 in FIG. 1, except for multiple fins and multiple gate structures. FIGS. 2-4 illustrate cross-sectional views of the FinFET device 100 along cross-section B-B. FIG. 5A is a cross-sectional view of the FinFET device 100 along cross-section A-A, and FIG. 5B is a cross-sectional view along cross-section B-B. FIGS. 6-10 illustrate cross-sectional views of the FinFET device 100 along cross-section A-A. FIG. 11A illustrates a cross-sectional view of the FinFET device 100 along cross-section A-A, FIG. 11B is a cross-sectional view along cross-section B-B, and FIG. 11C is a plan view of the FinFET device 100. FIG. 12A illustrates a cross-sectional view of the FinFET device 100 along cross-section B-B, and FIG. 12B is a plan view of the FinFET device 100. FIG. 13 illustrates cross-sectional views of the FinFET device 100 along cross-section B-B. FIG. 14A illustrates a cross-sectional view of the FinFET device 100 along cross-section B-B, and FIG. 14B is a plan view of the FinFET device 100. FIG. 17 illustrates a cross-sectional view of the FinFET device 100 along cross-section B-B. FIG. 18A illustrates a cross-sectional view of the FinFET device 100 along cross-section B-B, and FIG. 18B is a plan view of the FinFET device 100. FIG. 19 illustrates a cross-sectional view of the FinFET device 100 along cross-section B-B.

FIG. 2 illustrates a cross-sectional view of a substrate 50 along cross-section B-B. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon, germanium, a compound semiconductor such as silicon carbide, gallium arsenic, gallium phosphide, indium phosphide, indium arsenide, indium antimonide, or the like, an alloy semiconductor such as SiGe, GaAsP, AlInAs, AlGaAs, GaInAs, GaInP, GaInAsP, or the like, another kind of semiconductor material, or combinations thereof.

Referring to FIG. 3, the substrate 50 shown in FIG. 2 is patterned using, for example, photolithography and etching techniques. For example, a mask layer, such as a pad oxide layer 52 and an overlying pad nitride layer 56, may be formed over the substrate 50. The pad oxide layer 52 may be a thin film including silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof. The pad nitride layer 56 may be formed using low-pressure chemical vapor deposition (LPCVD) process, a plasma enhanced chemical vapor deposition (PECVD) process, or using another process.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58. As illustrated in FIG. 3, the patterned mask 58 includes patterned pad oxide 52 and patterned pad nitride 56.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50 using, for example, reactive ion etch (RIE), neutral beam etch (NBE), the like, or a combination thereof. The etch may be anisotropic. In some embodiments, the trenches 61 may be strips (in a plan view) parallel to each other, and closely spaced with respect to each other. In some embodiments, the trenches 61 may be continuous and surround the semiconductor strips 60. After semiconductor strips 60 are formed, the patterned mask 58 may be removed by etching or any suitable method.

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. An anneal process may be performed once the insulation material is formed. A planarization process, such as a chemical mechanical polish (CMP), may remove any excess insulation material (and, if present, the patterned mask 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed such that the upper portions of the semiconductor strips 60 protrude from between neighboring isolation regions 62 and form semiconductor fins 64 (also referred to as fins 64). The recessed isolation regions 62 may be shallow trench isolation (STI) regions in some embodiments. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. For example, a chemical oxide removal using a CERTAS® etch or an Applied Materials SICONI tool or dilute hydrofluoric (dHF) acid may be used. In some cases, the isolation regions 62 may be recessed using a dry etch, and the dry etch may use an etching gas such as ammonia, hydrogen fluoride, another etching gas, or a combination of etching gases. Other suitable etching processes may also be used to recess the isolation regions 62.

FIGS. 2 through 4 illustrate an embodiment of forming fins 64, but fins may be formed in various different processes. In one example, a dielectric layer can be formed over a top surface of a substrate and trenches can be etched through the dielectric layer. Homoepitaxial structures can be epitaxially grown in the trenches or heteroepitaxial structures can be epitaxially grown in the trenches using a material different from the substrate. The dielectric layer can then be recessed such that the homoepitaxial structures or heteroepitaxial structures protrude from the dielectric layer to form the fins. In other embodiments, heteroepitaxial structures can be used for the fins. For example, the semiconductor strips can be recessed, and a material different from the semiconductor strips may be epitaxially grown in their place.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In some embodiments, the channel regions of the semiconductor fins 64 may be doped using an implantation process. In some cases, the channel regions of different semiconductor fins 64 may be implanted to have the same dopant concentration or a different dopant concentration.

Figure 6:
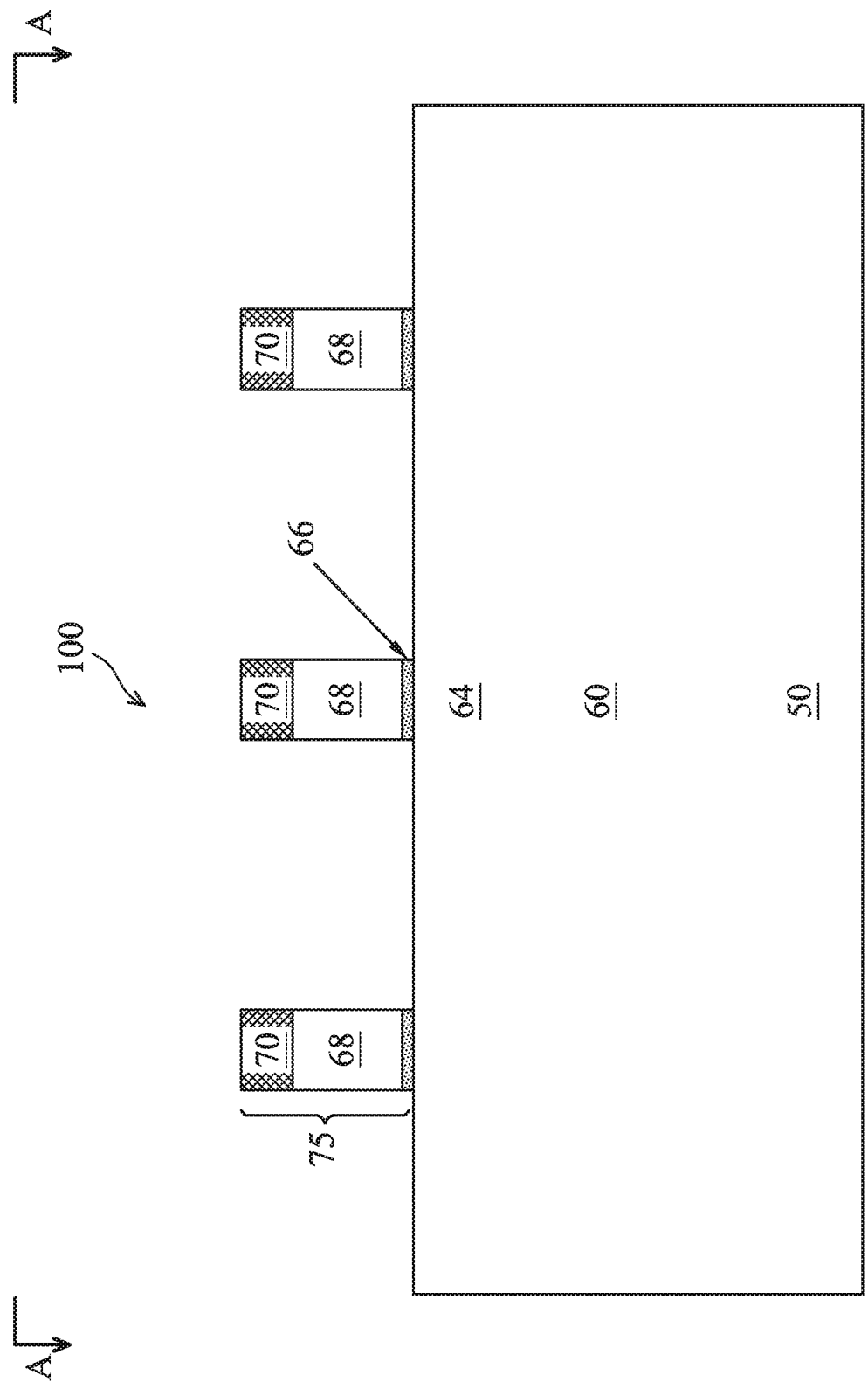

FIGS. 5A-B and FIG. 6 illustrate steps of forming dummy gate structures 75 over the semiconductor fins 64. The example dummy gate structures 75 include a dummy gate dielectric 66, a dummy gate fill 68, and a mask 70. To form the dummy gate structures 75, a dielectric material is first formed over the semiconductor fins 64 and the isolation regions 62. The dummy gate dielectric 66 will subsequently be formed from the dielectric material. The dielectric material may be, for example, silicon oxide, silicon nitride, multilayers thereof, or the like, and may be deposited or thermally grown according to acceptable techniques. In some embodiments, the dielectric material may be a high-k dielectric material, and in these embodiments, the dielectric material may have a k value greater than about 7.0, and may include a metal oxide or a silicate of Hf, Al, Zr, La, Mg, Ba, Ti, Pb, multilayers thereof, and combinations thereof. The formation methods of dielectric material may include molecular-beam deposition (MBD), atomic layer deposition (ALD), plasma-enhanced CVD (PECVD), and the like.

A dummy gate material is then formed over the dummy gate dielectric material, and a mask layer is formed over the gate material. The dummy gate fill 68 and mask 70 are subsequently formed from the dummy gate material and the mask layer, respectively. The dummy gate material may be deposited over the dielectric material and then planarized, such as by a CMP process. The mask layer may then be deposited over the planarized dummy gate material. In some embodiments, the dummy gate material may be formed of polysilicon, although other materials may also be used. In some embodiments, the gate material may include a metal-containing material such as TiN, TaN, TaC, Co, Ru, Al, combinations thereof, or multi-layers thereof. In some embodiments, the mask layer may be a hardmask, and may be formed of silicon nitride, although other materials may also be used.

After the dielectric material, the dummy gate material, and the mask layer are formed, the mask layer may be patterned using acceptable photolithography and etching techniques to form mask 70. For example, a photoresist 72 may be formed over the mask layer and patterned using photolithographic techniques, resulting in the example structure shown in FIGS. 5A-B. The pattern of photoresist 72 then may be transferred to the mask layer by a suitable etching technique to form mask 70. The pattern of the mask 70 then may be transferred to the dummy gate material and the dielectric layer by a suitable etching technique to form dummy gate fill 68 and dummy gate dielectric 66, respectively. An example resulting structure is shown in FIG. 6. The dummy gate fill 68 and dummy gate dielectric 66 cover respective channel regions of the semiconductor fins 64. The dummy gate fill 68 may also have a lengthwise direction substantially perpendicular to the lengthwise direction of respective semiconductor fins 64. Although three gate structures 75 are illustrated over a semiconductor fin 64 in the cross-sectional view of FIG. 6, more or fewer gate structures 75 may be formed over a semiconductor fin 64.

Figure 7:
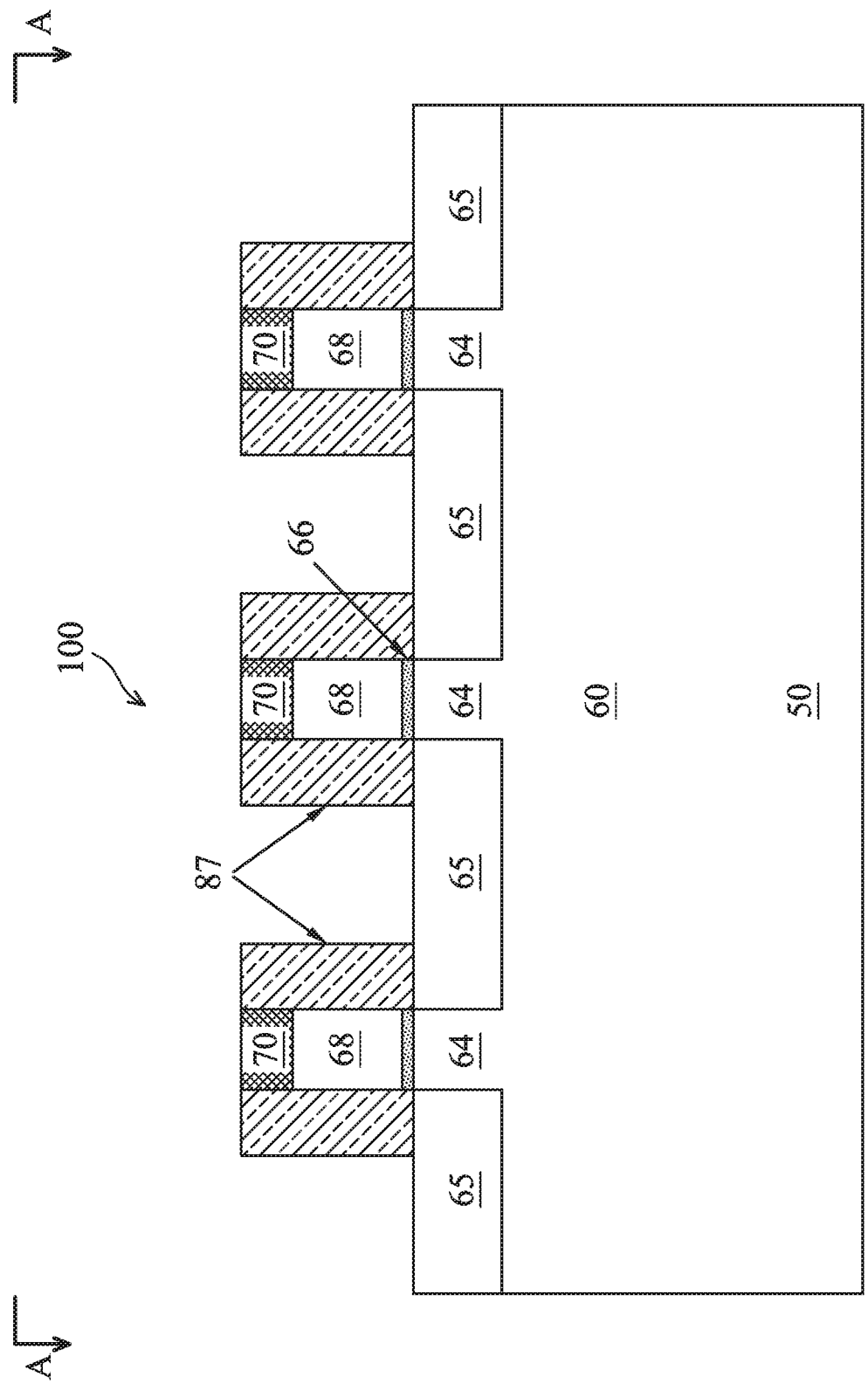

FIGS. 7-10 illustrate the cross-section views of further processing of the FinFET device 100 along cross-section A-A (i.e., along a longitudinal axis of the fin). As illustrated in FIG. 7, lightly doped drain (LDD) regions 65 are formed in the fins 64. The LDD regions 65 may be formed by an implantation process. The implantation process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 7 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed in other embodiments.

After the LDD regions 65 are formed, gate spacers 87 are formed on the gate structures 75. In the example of FIG. 7, the gate spacers 87 are formed on opposing sidewalls of the gate 68 and on opposing sidewalls of the gate dielectric 66. The gate spacers 87 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The gate spacers 87 may also extend over the upper surface of the semiconductor fins 64 and the upper surface of the isolation region 62.

The shapes and formation methods of the gate spacers 87 as illustrated in FIG. 7 are merely non-limiting examples, and other shapes and formation methods are possible. For example, the gate spacers 87 may include first gate spacers (not shown) and second gate spacers (not shown). The first gate spacers may be formed on opposing sidewalls of the gate structures 75. The second gate spacers may be formed on the first gate spacers, with the first gate spacers disposed between a respective gate structure 75 and the respective second gate spacers. In some cases, the first gate spacers may have an "L-shape" in a cross-sectional view. As another example, the gate spacers 87 may be formed after the epitaxial source/drain regions 80 (see FIG. 8) are formed. In some embodiments, dummy gate spacers are formed on the first gate spacers (not shown) before the epitaxial process of the epitaxial source/drain regions 80 illustrated in FIG. 8, and the dummy gate spacers are removed and replaced with the second gate spacers after the epitaxial source/drain regions 80 are formed. All such embodiments are fully intended to be included in the scope of the present disclosure.

Figure 8:
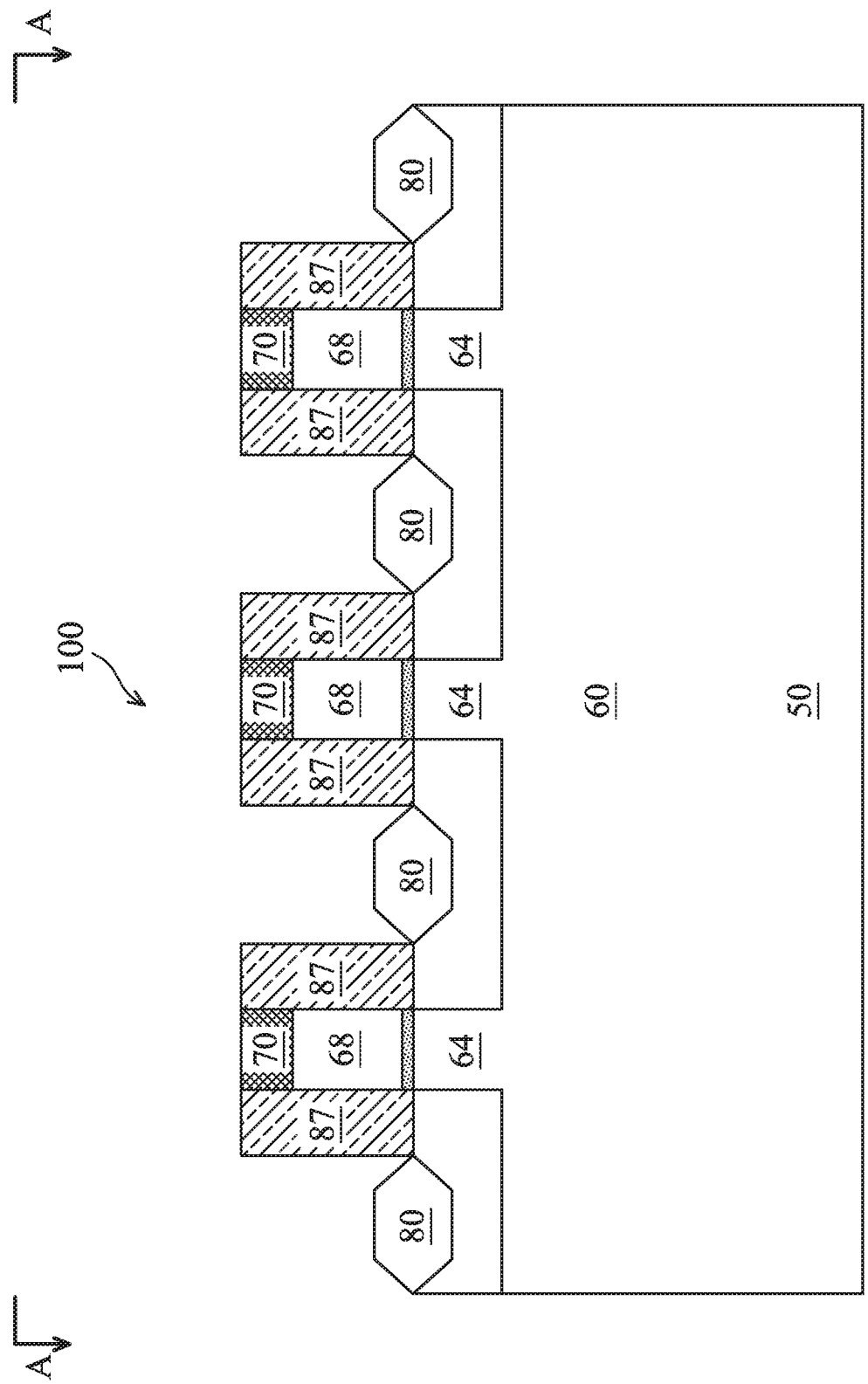

Next, as illustrated in FIG. 8, source/drain regions 80 are formed. The source/drain regions 80 are formed by etching the fins 64 to form recesses, and epitaxially growing a material in the recess. The epitaxial material of the source/drain regions 80 may be grown using suitable methods such as metal-organic CVD (MOCVD), molecular beam epitaxy (MBE), liquid phase epitaxy (LPE), vapor phase epitaxy (VPE), selective epitaxial growth (SEG), another process, or a combination thereof.

As illustrated in FIG. 8, the source/drain regions 80 may protrude above upper surfaces of the fins 64. In some cases, the source/drain regions 80 may have facets or may have irregular shapes. In some embodiments, the source/drain regions 80 of adjacent fins 64 may merge to form a continuous epitaxial source/drain region 80. In other embodiments, the source/drain regions 80 of adjacent fins 64 do not merge together and remain separate source/drain regions 80. In some embodiments, more than two adjacent epitaxial source/drain regions may be merged to form a continuous epitaxial source/drain region. In some embodiments in which the resulting FinFET is an n-type FinFET, source/drain regions 80 may include silicon carbide (SiC), silicon phosphorous (SiP), phosphorous-doped silicon carbon (SiCP), or the like. In some embodiments in which the resulting FinFET is a p-type FinFET, source/drain regions 80 may include silicon germanium (SiGe) and may include a p-type impurity such as boron (B) or indium (In). In some embodiments, silicon germanium in the source/drain regions 80 is formed to have a higher atomic percentage of germanium than silicon germanium in the channel region of the FinFET device, such that compressive strain is induced in the channel region of the FinFET device.

In some embodiments, epitaxial source/drain regions 80 may be implanted with dopants. The implanting process may include forming and patterning masks such as a photoresist to cover the regions of the FinFET that are to be protected from the implanting process. In some embodiments, portions of the source/drain regions 80 may have a dopant concentration range between about 1E19 cm$^{-3}$ and about 1E21 cm$^{-3}$. In some embodiments, the epitaxial source/drain regions may be in situ doped during epitaxial growth.

Next, as illustrated in FIGS. 9-11C, a first interlayer dielectric (ILD) 90 is formed over the structure illustrated in FIG. 8, and a gate-last process (sometimes referred to as replacement gate process) is performed. In a gate-last process, the dummy gate 68 and the dummy gate dielectric 66 are dummy structures that are removed and replaced with an active gate and active gate dielectric, which may be collectively referred to as a replacement gate.

Figure 9:
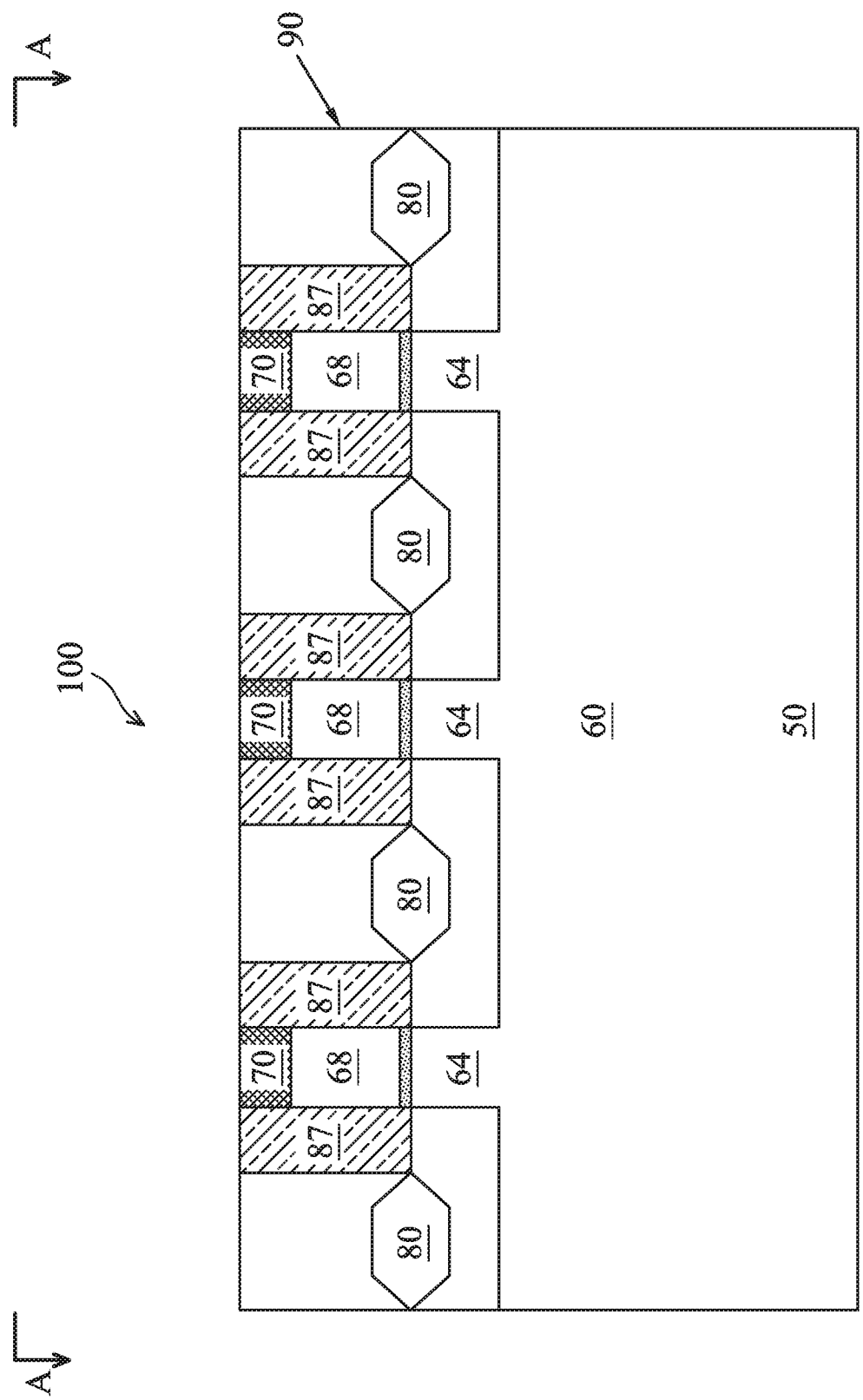

In FIG. 9, the first ILD 90 is formed. In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to planarize the top surface of the first ILD 90, as shown in FIG. 9. In some embodiments, a top surface of the dummy gate fill 68 is exposed after the CMP process.

Figure 10:
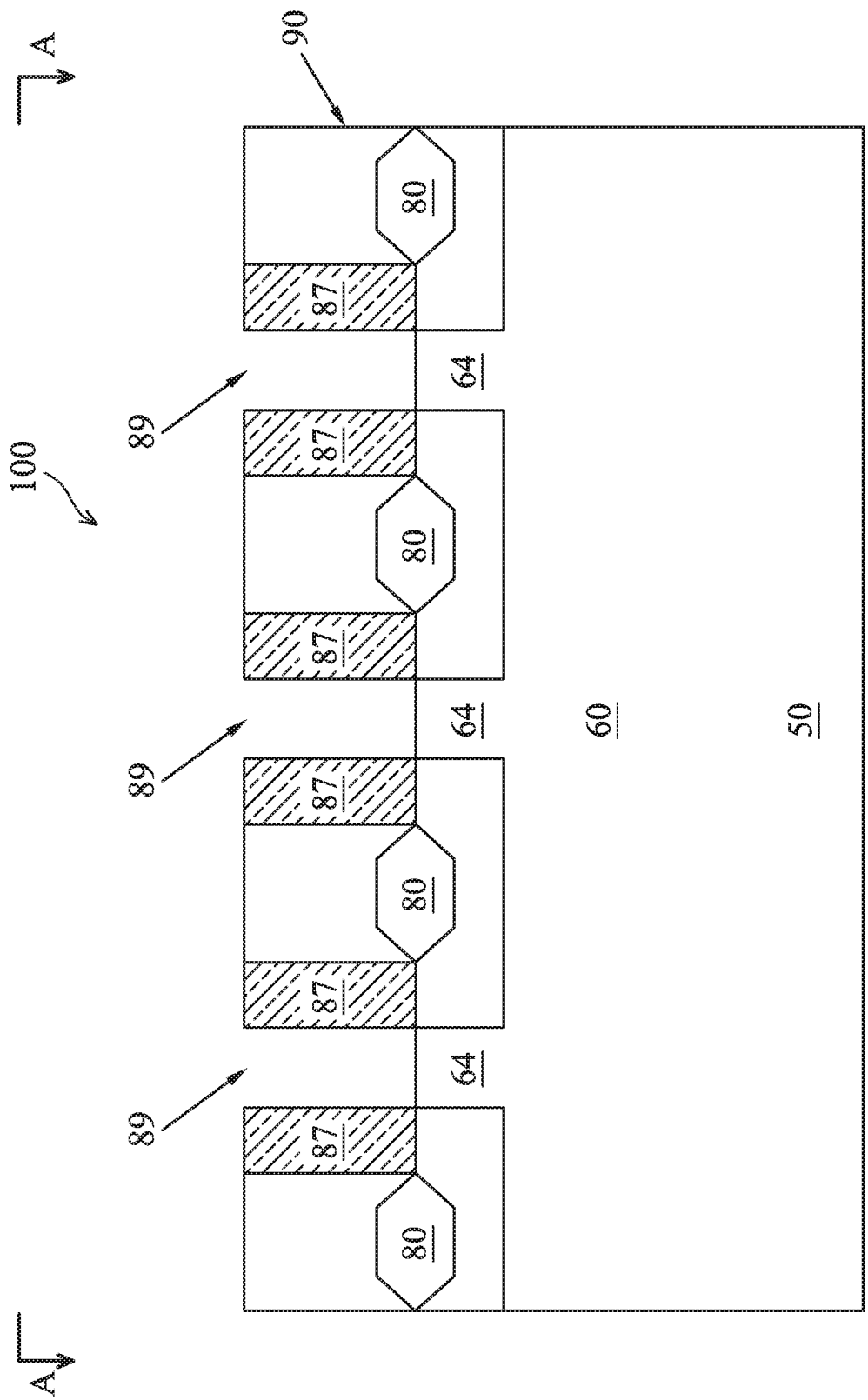

Next, in FIG. 10, the dummy gate fill 68 and the dummy gate dielectric 66 are removed in one or more etching steps, so that recesses 89 are formed between respective spacers 87. Each recess 89 exposes a channel region of a respective fin 64. Each channel region may be disposed between neighboring pairs of epitaxial source/drain regions 80. In some cases, the dummy gate dielectric 66 may be used as an etch stop layer when the dummy gate fill 68 is etched. The dummy gate dielectric 66 may then be removed after the removal of the dummy gate fill 68.

In FIGS. 11A-C, metal gates 97 are formed in the recesses 89 by forming a gate dielectric layer 96, a work-function layer 94, and a gate fill 98 successively in each of the recesses 89. As illustrated in FIGS. 11A-B, the gate dielectric layer 96 is deposited conformally in the recesses. The work-function layer 94 is formed conformally over the gate dielectric layer 96, and the gate fill 98 fills the remainder of the recesses 89. Although not shown, a barrier layer may be formed between the gate dielectric layer 96 and the work-function layer 94. For convenience in discussion below, FIGS. 11B-C and FIGS. 13-17 have indicated the four individual fins of the example semiconductor fins 64 shown as fins 64A, 64B, 64C, and 64D.

In accordance with some embodiments, the gate dielectric layer 96 includes silicon oxide (SiO), silicon nitride (SiN), or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, other materials, or combinations thereof. The formation methods of gate dielectric layer 96 may include MBD, ALD, PECVD, or other processes.

Next, a barrier layer is formed conformally over the gate dielectric layer 96. The barrier layer may include an electrically conductive material such as titanium nitride (TiN), although other materials may be used such as tantalum nitride (TaN), titanium (Ti), tantalum (Ta), the like, or combinations thereof. The barrier layer may be formed using a CVD process, such as plasma-enhanced CVD (PECVD). However, other processes, such as sputtering, metal organic chemical vapor deposition (MOCVD), atomic layer deposition (ALD), or other processes, may also be used.

The work-function layer 94 is formed conformally over the barrier layer. The work-function layer 94 may include one or more layers, and may include one or more suitable materials. The materials and layer thicknesses of the work-function layer 94 may be selected to adjust the threshold voltage (Vt) of the resulting FinFET in a predetermined manner. Exemplary p-type work-function metals that may be included in the metal gate 97 include TiN, TaN, Ru, Mo, Al, WN, ZrSi$_2$, MoSi$_2$, TaSi$_2$, NiSi$_2$, WN, other suitable p-type work-function materials, or combinations thereof. Exemplary n-type work-function metals that may be included in the metal gate 97 include Ti, Ag, TaAl, TaAlC, TiAlN, TaC, TaCN, TaSiN, Mn, Zr, other suitable n-type work-function materials, or combinations thereof. A work-function value is associated with the material composition of a work-function layer 94, and thus, the materials of the work-function layer 94 may be chosen to tune its work-function value so that a target threshold voltage (Vt) is achieved in the device that is to be formed in the respective region. In some embodiments, different work-function layers may be used in different regions of the metal gate 97. For example, a first work-function layer may be deposited over one of the semiconductor fins 64 and a second work-function layer may be deposited over another of the semiconductor fins 64, in which the second work-function layer includes different materials or layers than the first work-function layer. The work-function layer 94 may be deposited by CVD, PVD, ALD, and/or other suitable process.

Next, the gate fill 98 is formed over the work-function layer 94. The gate fill 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work-function layer 94, and the material of the gate fill 98, which excess portions are over the top surface of the first ILD 90. The resulting remaining portions of material of the gate fill 98, the work-function layer 94, and the gate dielectric layer 96 thus form metal gates 97 of the resulting FinFET device 100.

Referring now to FIG. 11C, a representative plan view of the FinFET device 100 shown in FIGS. 11A-B is illustrated. FIG. 11C illustrates multiple metal gates 97 crossing semiconductor fins 64. For clarity, not all features of the FinFET device 100 are illustrated. For example, the gate spacers 87, the isolation regions 62, and the source/drain regions 80 are not illustrated in FIG. 11C. An example cross-section along B-B, such as that shown in FIG. 11B, is also indicated. In subsequent processing, a metal gate cutting process is performed to cut metal gates 97 crossing fins 64A-D into two separate metal gates crossing first fins 64A-B and second fins 64C-D, respectively. The first fins 64A-B are then isolated from the second fins 64C-D by an insulating dielectric material.

Details of a metal gate cutting and fin isolation process are illustrated in FIGS. 12A-18B, in accordance with an embodiment. FIG. 12A illustrates a cross-sectional view of the FinFET device 100 along cross-section B-B, and FIG. 12B illustrates the FinFET device 100 in a representative plan view. In FIG. 12A, a first hard mask layer 122 and a second hard mask layer 124 are formed consecutively over the FinFET device 100. Subsequently, a structure 133 is formed over the second hard mask layer 124. In some embodiments, structure 133 is a tri-layer structure that includes a top photoresist layer 136, a middle layer 134, and a bottom anti-reflective coating (BARC) layer 132, as shown in FIG. 12A.

In some embodiments, the first hard mask layer 122 is a metal hard mask layer and the second hard mask layer 124 is a dielectric hard mask layer. In subsequent processing steps, a pattern is transferred onto the first hard mask layer 122 using various photolithography and etching techniques. The first hard mask layer 122 may then be used as a patterning mask for etching the underlying structure (e.g., metal gates 97). The first hard mask layer 122 may be a masking material such as titanium nitride, titanium oxide, the like, or a combination thereof. The first hard mask layer 122 may be formed using a process such as ALD, CVD, PVD, the like, or a combination thereof.

The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, tetraethyl orthosilicate (TEOS), $SiO_xC_y$, the like, or a combination thereof. The second hard mask layer 124 may be formed using a process such as CVD, ALD, the like, or a combination thereof. In an exemplary embodiment, the first hard mask layer 122 includes titanium nitride, and the second hard mask layer 124 includes silicon nitride.

The tri-layer structure 133 is formed over the second hard mask layer 124. The BARC layer 132 of the tri-layered structure 133 may include an organic or inorganic material. The middle layer 134 may include silicon nitride, silicon oxynitride, or the like. The middle layer 134 may have an etch selectivity to the top photoresist layer 136, such that the top photoresist layer 136 can be used as a mask layer to pattern the middle layer 134. The top photoresist layer 136 may include a photosensitive material. Any suitable deposition method, such as PVD, CVD, spin coating, the like, or combinations thereof, may be used to form layers of the tri-layered structure 133.

As shown in FIGS. 12A-B, once the tri-layer structure 133 is formed, a pattern is formed in the top photoresist layer 136. A pattern is shown in FIGS. 12A-B as example opening 137. The top photoresist layer 136 may be patterned using a suitable photolithographic technique. In some embodiments, the opening 137 may have a width W of between about 10 nm and about 40 nm. As shown in FIGS. 12A-B, fin 64B is separated from the opening 137 by a lateral distance D1, and fin 64C is separated from the opening 137 by a lateral distance D2. In some embodiments, a fin 64 may be separated from an opening 137 by a lateral distance of between about 15 nm and about 500 nm. In some embodiments, a lateral distance separating a fin 64 and an opening 137 may be determined according to a threshold voltage (Vt) desired for a resulting FinFET device 100, described below in greater detail. FIG. 12A shows lateral distances D1 and D2 as being determined relative to the mid-height of fins 64B and 64C, respectively. In other cases, a lateral distance between a fin 64 and an opening 137 may be determined relative to another location of the fin 64, such as the top of the fin 64, the bottom of the fin 64, the center of the fin 64, an average of two or more locations on the fin 64, etc.

Next, as illustrated in FIG. 13, the pattern of opening 137 in the top photoresist layer 136 is extended through the middle layer 134 and the BARC layer 132, and is also transferred to the first hard mask layer 122 and the second hard mask layer 124. The pattern of opening 137 may be transferred in this manner using suitable techniques, such as the use of one or more anisotropic etching processes. As a result, an opening 139 is formed in the first hard mask layer 122 and the second hard mask layer 124. The fin 64B is separated from the opening 139 by lateral distance D1, and fin 64C is separated from the opening 139 by lateral distance D2. The opening 139 exposes the metal gate 97. In some cases, the etching process used to form the opening 139 also recesses top portions of the metal gate 97.

Next, as illustrated in FIGS. 14A-B, portions of the metal gate 97 exposed by the opening 139 are removed. FIG. 14A illustrates a cross-sectional view of the FinFET device 100 along cross-section B-B, and FIG. 14B illustrates the FinFET device 100 in a representative plan view. The portions of the metal gate 97 may be removed using an etching process, such as an anisotropic etching process or other etching process. Removing portions of the metal gate 97 may include removing portions of the gate dielectric layer 96, the work function layer 94, or the material of the gate fill 98. Removing the portions of the metal gate 97 forms a recess 141 that separates metal gate 97 into a first metal gate 97A over first fins 64A-B and a second metal gate 97B over second fins 64C-D. The fin 64B is separated from the recess 141 by lateral distance D1, and fin 64C is separated from the recess 141 by lateral distance D2. The recess 141 exposes portions of the isolation regions 62. In some cases, the etching process used to form the recess 141 also recesses top portions of the isolation regions 62. While FIGS. 14A-B show width W and distances D1 and D2 as being the same as those shown previously in FIGS. 12A-B, those skilled in the art will understand that process methodology and/or process variation may cause width W, distance D1, or distance D2 to vary or deviate over the course of processing. Any such variations or deviations during processing are within the scope of this disclosure.

In some embodiments, the etching process includes a plasma etching process. In some embodiments, the plasma etching process is performed in a processing chamber with a process gas being supplied into the processing chamber. Process gases may include $CF_4$, $C_2F_6$, $BCl_3$, $SiCl_4$, $O_2$, other gases, or a combination of gases. The process gases may be flowed into the processing chamber at a rate between about 10 sccm and about 500 sccm. Carrier gases, such as nitrogen, argon, helium, xenon, or the like, may be used to carry process gases into the processing chamber. The plasma etching process may performed using a bias voltage between about 500 volts to about 2000 volts, and having a power between about 500 watts to about 1000. The plasma etching process may be performed at a temperature between about 50° C. and about 200° C. A pressure in the processing chamber may be between about 50 mTorr and about 5 Torr. The plasma exposure may be for a pre-determined duration of time, such as between about 500 seconds and about 2000 seconds. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma generator, inductively coupled plasma systems, magnetically enhanced reactive ion techniques, electron cyclotron resonance techniques, or the like.

In some cases, the etching process performed to remove portions of the metal gate 97 may affect the threshold voltage (Vt) of the resulting FinFET 100. For example, materials such as etchants and etch products introduced during the etching of the metal gate 97 may diffuse into fins 64 adjacent to the recess 141 or diffuse into layers formed on the adjacent fins 64 such as the gate dielectric layer 96, the barrier layer 94, or any work-function layers. The presence of these materials near the gate dielectric layer 96 of a fin 64 can cause the threshold voltage of that fin 64 to shift. If a fin 64 is located farther from the etched recess 141, fewer materials are able to diffuse to that fin 64. Thus, the amount of threshold voltage shift of a fin 64 is determined in part on the separation distance between that fin 64 and the recess 141 (e.g., distances D1 or D2). In this manner, the voltage threshold may be adjusted by a "proximity effect" correlating with the separation distance.

Figure 15:
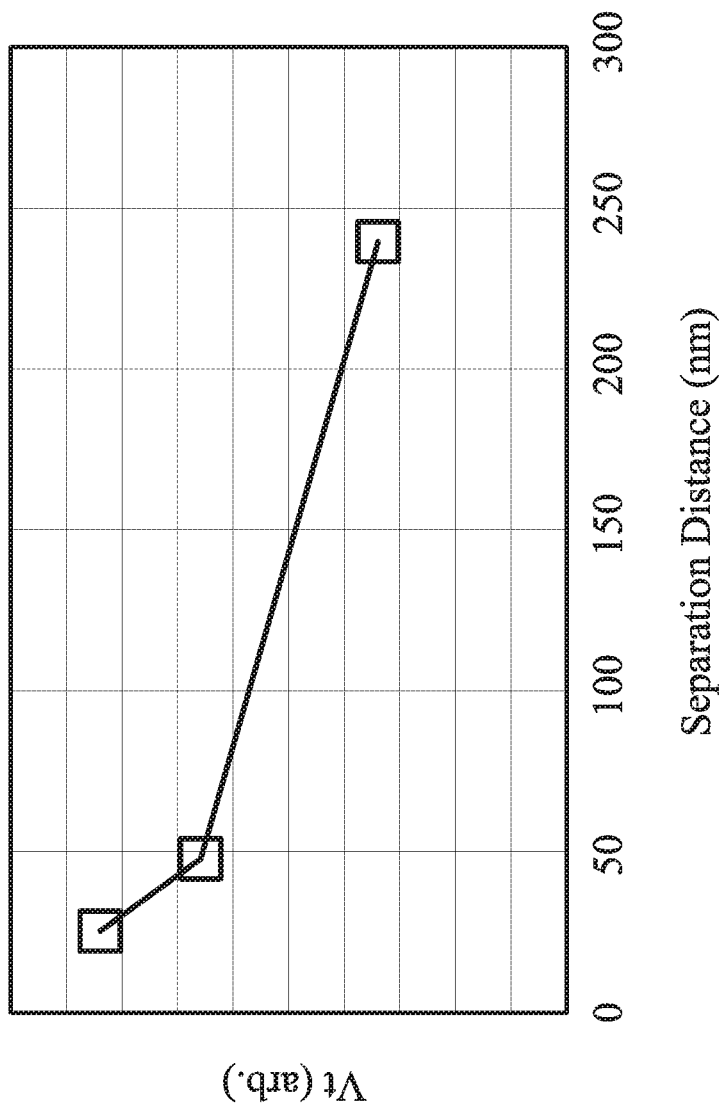
FIG. 15 illustrates example measurement data of the separation distance of a fin versus the threshold voltage of that fin, in accordance with an embodiment.

FIG. 15 illustrates measurement data of the threshold voltage (Vt) of a fin in a FinFET device versus the separation distance between that fin and the etched recess. As shown in FIG. 15, a fin having a smaller separation distance has a larger threshold voltage (Vt) shift than a fin having a larger separation distance. In these measurements, a smaller separation distance causes a more positive shift in the threshold voltage of the fin. As an example, in some cases, reducing a fin's separation distance by about 45 nm may increase the threshold voltage of the fin by about 35 mV. In some embodiments, the threshold voltage shift due to separation distance may be as great as about 100 mV.

The threshold voltage of a fin may be controlled or tuned by controlling the separation distance between that fin and the etched recess. For example, in the embodiment shown in FIGS. 2-14B, the threshold voltages of fin 64B and fin 64C may be controlled by the position and width of the recess 141. The width and position of opening 137 (of FIGS. 12A-B) may be determined such that the subsequent recess 141 is distance D1 from fin 64B and distance D2 from fin 64C. The distance D1 correlates with a first threshold voltage shift for fin 64B, and the distance D2 correlates with a second threshold voltage shift for fin 64C. As D1 is larger than D2, the first threshold voltage shift of fin 64B is less than the second threshold voltage shift of fin 64C. In some embodiments, the width of the etched recess (e.g., width W of recess 141) may be adjusted to control the separation distance of one or more adjacent fins and thus control the threshold voltage of the one or more adjacent fins. By controlling a separation distance of the recess (e.g., distances D1 or D2) and/or a width of the recess (e.g., width W), a desired voltage threshold can be achieved in one or more fins adjacent to that recess. In this manner, the threshold voltage of a FinFET may be tuned by controlling the separation distance of a fin of the FinFET. In some embodiments, the threshold voltage of two FinFETs may be tuned such that the FinFETs have about the same threshold voltage. For example, by controlling one or more appropriate separation distances, the threshold voltages of two FinFETs having two different work-function layers may be tuned to be more similar.

In some embodiments, by combining separation distance control with the use of different work-function layers, more threshold voltages may be available, and a greater range of available threshold voltages may be achieved. Additionally, by patterning such that different fins have different separation distances, FinFETs having different threshold voltages may be formed on the same substrate. In some cases, a FinFET device may have multiple fins, and only the fins adjacent to an etched recess have a shifted threshold voltage as described. For example, a FinFET device may have two or more fins sharing a metal gate, and the overall threshold voltage of the FinFET device may be controlled by controlling the separation distance of those fins that are adjacent to a recess. In some embodiments, a single fin may have a first recess adjacent to a first side of the fin and a second recess adjacent to the opposite side of the fin. The separation distance between the fin and the first recess may be the same or different than the separation distance between the fin and the second recess.

Figure 16:
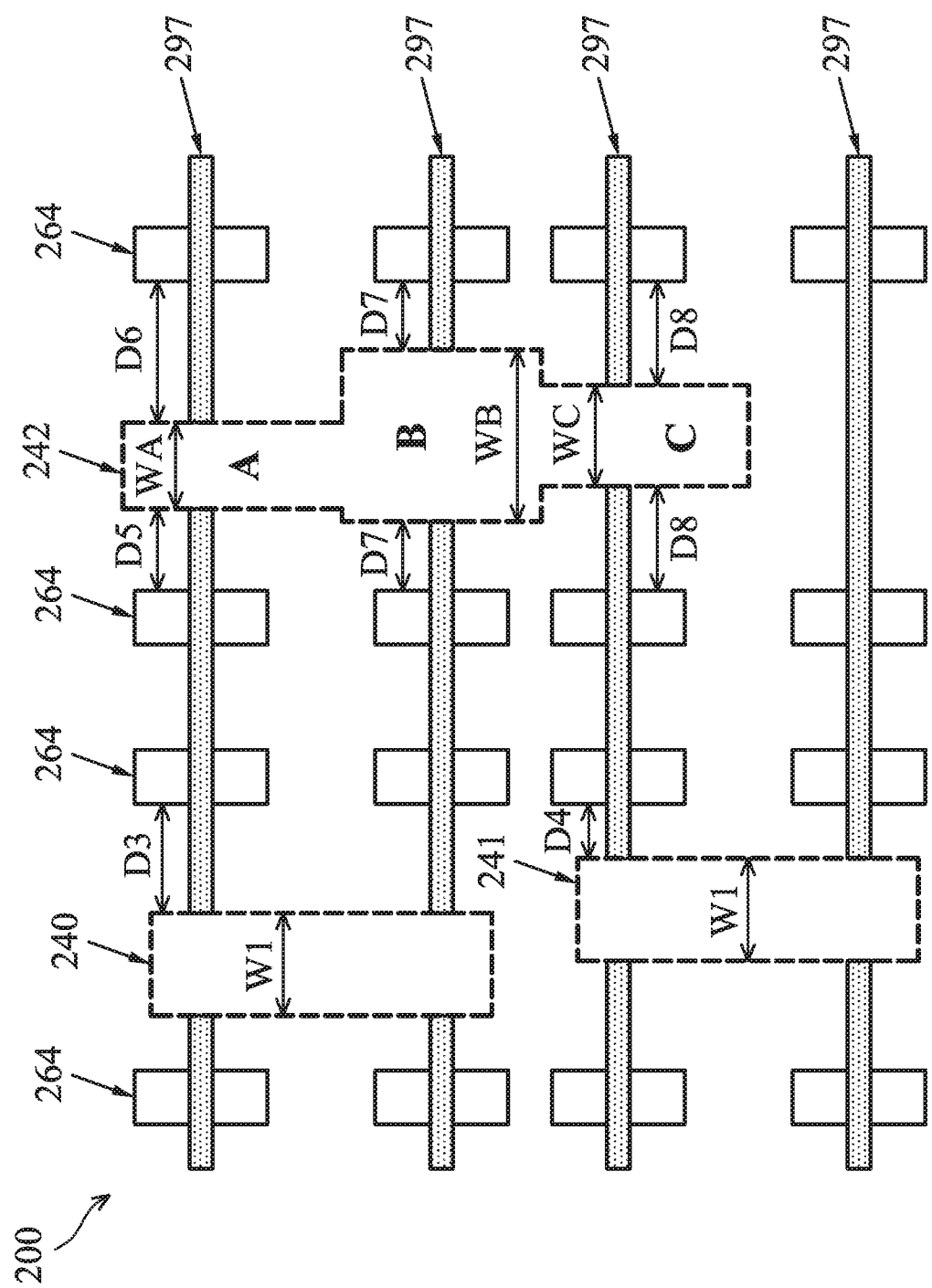
FIG. 16 illustrates a plan view of a FinFET device during fabrication, in accordance with an embodiment.

In some embodiments, multiple recesses similar to recess 141 may be formed within a single FinFET device. The number of recesses, the size of the recesses, and the locations of the recesses may be varied to control different voltage threshold voltage shifts of different fins within the FinFET device. As an illustrative example, FIG. 16 illustrates representative plan view of a FinFET device 200 in accordance with some embodiments. The FinFET device 200 is similar to the FinFET 30 shown in FIG. 1 or the FinFET device 100 shown in FIG. 14B. The FinFET device 200 includes semiconductor fins 264 and metal gates 297, which may be similar to the semiconductor fins 64 and metal gate 97 of FinFET device 100. FIG. 16 shows FinFET device 200 after etching example recesses 240, 241, and 242, which may be similar to recess 141 of FinFET device 100. As shown in FIG. 16, first recess 240 and second recess 241 both have a width of about W1. However, as shown in FIG. 16, first recess 240 is located between adjacent fins so as to have a separation distance D3, but second recess 241 is located between adjacent fins so as to have a different separation distance D4. Thus, the fins 264 separated by distance D3 have a different threshold voltage shift than the fins 264 separated by distance D4. In this example, first recess 240 is separated from second recess 241, though recesses 240 and 241 may be connected in other embodiments. As another example, FIG. 16 shows a third recess 242 which has three differently-shaped contiguous regions, designated 242A, 242B, and 242C. Regions 242A, 242B, and 242C have different widths WA, WB, and WC, respectively. Region 242A is located closer to one adjacent fin than the other. Region 242A is separated from one adjacent fin 264 by distance D5 and is separated from the opposite adjacent fin 264 by a different distance D6. Thus, the adjacent fin 264 separated by distance D5 has a different voltage threshold voltage shift than the opposite adjacent fin 264 separated by distance D6. Both region 242B and 242C are located equidistant from respective adjacent fins 264, but region 242B has a width WB and region 242C has a different width WC. Thus, each fin 264 adjacent to region 242B (separated by distance D7) has the same threshold voltage shift, and each fin 264 adjacent to region 242C (separated by distance D8) has the same threshold voltage shift. Due to the different widths of regions 242B and 242C, the fins 264 adjacent to region 242B have a different threshold voltage shift than the fins 264 adjacent to region 242C. These are illustrative examples of some shapes and locations of recesses that may be used to control the threshold voltages of fins in a FinFET device, and other shapes, locations, or configurations are possible. These and other variations of the recesses are fully intended to be included within the scope of the present disclosure.

Turning now to FIG. 17, the recess 141 is filled by dielectric material to form a gate isolation feature 106 between first metal gate 97A and second metal gate 97B. In the example illustrated of FIG. 15, the recess 141 is filled by a first dielectric layer 142 and a second dielectric layer 144, which may or may not be the same dielectric material. Suitable materials for the first dielectric layer 142 and the second dielectric layer 144 may include silicon nitride, silicon oxynitride, silicon carbide, other insulating materials, and the like. The first dielectric layer 142 and the second dielectric layer 144 may be formed by PVD, CVD, ALD, or another suitable deposition method. In some embodiments, the first dielectric layer 142 and the second dielectric layer 144 include a same material formed by different deposition methods. For example, the first dielectric layer 142 may include silicon nitride formed by an ALD process, and the second dielectric layer 144 may include silicon nitride formed by a PECVD process.

Next, as illustrated in FIGS. 18A and 18B, a planarization process, such as a CMP process, is performed to remove the first hard mask layer 122, the second hard mask layer 124, and portions of the first dielectric layer 142 and second dielectric layer 144 over the upper surface of the second hard mask layer 124. FIG. 18A illustrates a cross-sectional view of the FinFET device 100 along cross-section B-B, and FIG. 18B illustrates the FinFET device 100 in a representative plan view.

Next, as illustrated in FIG. 19, contacts 102 are formed over and electrically connected to the metal gates 97. To form the contacts 102, a second ILD 95 is formed over the first ILD 90. In some embodiments, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Next, contact openings are formed through the first ILD 90 and/or the second ILD 95 to expose the source/drain regions 80 and the metal gates 97, which contact openings are then filled with electrically conductive material(s) to form the contacts 102. In some embodiments, silicide regions (not shown) are formed over the source/drain regions before the contact openings are filled.

A barrier layer 104 is formed lining sidewalls and bottoms of the contact openings, over the silicide regions 81, and over the upper surface of the second ILD 95. The barrier layer 104 may include titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed onto the seed layer 108, filling and overfilling the contact openings. The conductive material 110 may include tungsten, although other suitable materials such as aluminum, copper, tungsten nitride, ruthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess barrier layer 104, seed layer 109, and conductive material 110 outside of the contact openings may be removed through a planarization process such as CMP, although any suitable removal process may be used. Contacts 102 are thus formed in the contact openings. In addition, in FIG. 19, two contacts 102 are shown connected to each of the two metal gates 97A and 97B as examples. The number and the location of the contacts 102 connected to each of the metal gates 97A and 97B may be different without departing from the spirit of the present disclosure, and these and other modifications are fully intended to be included within the scope of the present disclosure.

Embodiments may achieve advantages. The present disclosure allows for tuning of the threshold voltage of a transistor outside of the dummy gate replacement process. The use of the techniques described herein may allow for the use of fewer different work-function layer materials. By reducing the number of different work-function layer materials needed, the number of process steps needed is also reduced. Different transistors on the same substrate may be formed having different threshold voltages using the same process flow. The techniques described also use existing process flows without the use of additional steps and thus without additional cost.

In an embodiment, a method includes forming a first semiconductor fin in a substrate, forming a metal gate structure over the first semiconductor fin, removing a portion of the metal gate structure to form a first recess in the metal gate structure that is laterally separated from the first semiconductor fin by a first distance, wherein the first distance is determined according to a first desired threshold voltage associated with the first semiconductor fin, and filling the recess with a dielectric material. In an embodiment, the method further includes forming a second semiconductor fin in the substrate, wherein the metal gate structure is formed over the second semiconductor fin, and wherein the first recess in the metal gate structure is laterally separated from the second semiconductor fin by a second distance, wherein the second distance is based on a second desired threshold voltage associated with the second semiconductor fin. In an embodiment, the first distance is different than the second distance, and the first expected threshold voltage is different than the second expected threshold voltage. In an embodiment, removing the portion of the metal gate structure includes a plasma etching process. In an embodiment, filling the recess includes an Atomic Layer Deposition (ALD) process and a Plasma-Enhanced Chemical Vapor Deposition (PECVD) process. In an embodiment, the dielectric material includes silicon nitride (SiN). In an embodiment, removing the portion of the metal gate structure includes forming a hard mask layer over the metal gate structure, patterning the hard mask layer, and etching the metal gate structure using the patterned hard mask layer as an etch mask. In an embodiment, forming a metal gate structure over the first semiconductor fin includes forming at least one work-function material over the first semiconductor fin. In an embodiment, the method further includes forming a third semiconductor fin in the substrate, wherein the metal gate structure is formed over the third semiconductor fin, and removing a portion of the metal gate structure to form a second recess in the metal gate structure that is laterally separated from the third semiconductor fin by the first distance.

In an embodiment, a method of forming a semiconductor device includes forming a first fin in a first region over a substrate, wherein the first fin is a fin of a first Fin Field-Effect Transistor (FinFET), forming a second fin in a second region over the substrate, the second fin being adjacent to the first fin, wherein the second fin is a fin of a second FinFET, forming a dummy gate structure over the first fin and the second fin, replacing the dummy gate structure with a metal gate structure, and forming an isolation feature in the metal gate structure, which includes etching a recess in the metal gate structure between the first fin and the second fin and filling the recess with an insulating material, wherein forming the isolation feature causes a first threshold voltage shift of the first FinFET and a second threshold voltage shift of the second FinFET. In an embodiment, the first threshold voltage shift is different than the second threshold voltage shift. In an embodiment, the insulating material is silicon nitride (SiN). In an embodiment, the isolation feature is separated from the first fin by a first distance and is separated from the second fin by a second distance. In an embodiment, the first distance is the same as the second distance. In an embodiment, the metal gate structure includes a work-function layer. In an embodiment, the first fin is one of multiple fins of the first FinFET. In an embodiment, a first portion of the metal gate structure over the first fin includes first work-function layers, and a second portion of the metal gate structure over the second fin includes second work-function layers that are different from the first work-function layers. In an embodiment, after forming the isolation feature, the first FinFET has a first threshold voltage and the second FinFET has a second threshold voltage, and the first threshold voltage is about the same as the second threshold voltage.

In an embodiment, a device includes a first Fin Field-Effect Transistor (FinFET) and a second FinFET on a substrate, wherein the first FinFET includes a first fin extending in a first direction and a first metal gate extending over the first fin in a second direction perpendicular to the first direction, wherein the second FinFET includes a second fin extending in the first direction and a second metal gate extending over the second fin in the second direction, wherein the second metal gate is aligned to the first metal gate along the second direction. The device also includes a first isolation region adjacent the first fin and extending in the first direction, wherein the first metal gate extends a first distance along the second direction from the first isolation region to the first fin and a second isolation region adjacent the second fin and extending in the first direction, wherein the second metal gate extends a second distance along the second direction from the second isolation region to the second fin, wherein the second distance is different from the first distance. In an embodiment, the first FinFET has a first threshold voltage and the second FinFET has a second threshold voltage, wherein the first threshold voltage is different than the second threshold voltage. In an embodiment, the first metal gate and the second metal gate include a work-function layer. In an embodiment, the first isolation region is contiguous with the second isolation region. In an embodiment, the first fin includes a first channel region having a first concentration of implanted dopants, and the second fin includes a second channel region having a second concentration of implanted dopants that is about the same as the first concentration of implanted dopants. In an embodiment, the first FinFET and the second FinFET are two transistors of a six-transistor (6T) SRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   specifying a first desired threshold voltage;
   forming a first semiconductor fin in a substrate;
   forming a dummy gate structure over the first semiconductor fin;
   replacing the dummy gate structure with a metal gate structure, comprising removing the dummy gate structure and then forming the metal gate structure;
   removing a portion of the metal gate structure to form a first recess in the metal gate structure, wherein the first recess is laterally separated from the first semiconductor fin by a first distance, wherein the first distance is determined according to the first desired threshold voltage, wherein the first desired threshold voltage is associated with the first semiconductor fin; and
   filling the recess with a dielectric material.

2. The method of claim 1, further comprising forming a second semiconductor fin in the substrate, wherein the metal gate structure is formed over the second semiconductor fin, and wherein the first recess in the metal gate structure is laterally separated from the second semiconductor fin by a second distance, wherein the second distance is based on a second desired threshold voltage associated with the second semiconductor fin.

3. The method of claim 2, wherein the first distance is different than the second distance, and wherein the first expected threshold voltage is different than the second expected threshold voltage.

4. The method of claim 1, wherein removing the portion of the metal gate structure comprises a plasma etching process.

5. The method of claim 1, wherein filling the recess comprises an Atomic Layer Deposition (ALD) process and a Plasma-Enhanced Chemical Vapor Deposition (PECVD) process.

6. The method of claim 1, wherein the dielectric material comprises silicon nitride (SiN).

7. The method of claim 1, wherein removing the portion of the metal gate structure comprises:
   forming a hard mask layer over the metal gate structure;
   patterning the hard mask layer; and etching the metal gate structure using the patterned hard mask layer as an etch mask.

8. The method of claim 1, wherein forming a metal gate structure over the first semiconductor fin comprises forming at least one work-function material over the first semiconductor fin.

9. The method of claim 1, further comprising:
forming a third semiconductor fin in the substrate, wherein the metal gate structure is formed over the third semiconductor fin; and
removing a portion of the metal gate structure to form a second recess in the metal gate structure that is laterally separated from the third semiconductor fin by the first distance.

10. A method of forming a semiconductor device comprising:
forming a first fin in a first region over a substrate, wherein the first fin is a fin of a first Fin Field-Effect Transistor (FinFET);
forming a second fin in a second region over the substrate, the second fin being adjacent to the first fin, wherein the second fin is a fin of a second FinFET;
specifying a first desired threshold voltage range for the first FinFET and a second desired threshold voltage range for the second FinFET;
forming a dummy gate structure over the first fin and the second fin;
replacing the dummy gate structure with a metal gate structure; and
forming an isolation feature in the metal gate structure, comprising:
etching a recess in the metal gate structure between the first fin and the second fin; and
filling the recess with an insulating material;
wherein before forming the isolation feature, the first FinFET has a threshold voltage that is outside of the first desired threshold voltage range and the second FinFET has a threshold voltage that is outside of the second desired threshold voltage range, wherein forming the isolation feature causes a first threshold voltage shift of the threshold voltage of the first FinFET to within the first desired threshold voltage range and causes a second threshold voltage shift of the threshold voltage of the second FinFET to within the second desired threshold voltage range.

11. The method of claim 10, wherein the first threshold voltage shift is different than the second threshold voltage shift.

12. The method of claim 10, wherein a first portion of the metal gate structure over the first fin comprises first work-function layers, and wherein a second portion of the metal gate structure over the second fin comprises second work-function layers that are different from the first work-function layers.

13. The method of claim 12, wherein, after forming the isolation feature, the first FinFET has a first threshold voltage and the second FinFET has a second threshold voltage, and wherein the first threshold voltage is about the same as the second threshold voltage.

14. The method of claim 10, wherein the isolation feature is separated from the first fin by a first distance and is separated from the second fin by a second distance.

15. The method of claim 14, wherein the first distance is the same as the second distance.

16. The method of claim 10, wherein the first fin is one of a plurality of fins of the first FinFET.

17. A method comprising:
forming a first Fin Field-Effect Transistor (FinFET) and a second FinFET on a substrate, wherein forming the first FinFET comprises forming a first fin extending in a first direction and forming a first metal gate extending over the first fin in a second direction perpendicular to the first direction, wherein forming the second FinFET comprises forming a second fin extending in the first direction and forming a second metal gate extending over the second fin in the second direction, wherein the second metal gate is aligned to the first metal gate along the second direction;
forming a first isolation region adjacent the first fin and extending in the first direction, wherein the first isolation region physically contacts a sidewall of the first metal gate along the first direction, wherein the first metal gate extends a first distance along the second direction from the first isolation region to the first fin; and
forming a second isolation region adjacent the second fin and extending in the first direction, wherein the second isolation region physically contacts a sidewall of the second metal gate along the first direction, wherein the second metal gate extends a second distance along the second direction from the second isolation region to the second fin, wherein the second distance is different from the first distance.

18. The method of claim 17, wherein the first FinFET has a first threshold voltage and the second FinFET has a second threshold voltage, wherein the first threshold voltage threshold is different than the second threshold voltage threshold.

19. The method of claim 17, further comprising forming a first channel region in the first fin having a first concentration of implanted dopants and forming a second channel region in the second fin having a second concentration of implanted dopants that is about the same as the first concentration of implanted dopants.

20. The method of claim 17, wherein the first FinFET and the second FinFET are two transistors of a six-transistor (6T) SRAM cell.

* * * * *